United States Patent
Kondiles et al.

(10) Patent No.: US 12,141,145 B2
(45) Date of Patent: *Nov. 12, 2024

(54) SELECTIVE CONFIGURATION OF FILE SYSTEM MANAGEMENT FOR PROCESSING RESOURCES OF A DATABASE SYSTEM

(71) Applicant: Ocient Holdings LLC, Chicago, IL (US)

(72) Inventors: George Kondiles, Chicago, IL (US); Jason Arnold, Chicago, IL (US)

(73) Assignee: Ocient Holdings LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/538,647

(22) Filed: Dec. 13, 2023

(65) Prior Publication Data

US 2024/0111769 A1     Apr. 4, 2024

Related U.S. Application Data

(63) Continuation of application No. 18/165,462, filed on Feb. 7, 2023, now Pat. No. 11,874,833, which is a
(Continued)

(51) Int. Cl.
   *G06F 9/44*       (2018.01)
   *G06F 3/06*       (2006.01)
   (Continued)

(52) U.S. Cl.
   CPC ...... *G06F 16/24542* (2019.01); *G06F 3/0604* (2013.01); *G06F 3/0647* (2013.01);
   (Continued)

(58) Field of Classification Search
   CPC ......... G06F 16/24542; G06F 16/24573; G06F 16/22; G06F 16/2458; G06F 16/2246;
   (Continued)

(56) References Cited

U.S. PATENT DOCUMENTS 5,548,770 A     8/1996  Bridges
6,230,200 B1    5/2001  Forecast
(Continued)

OTHER PUBLICATIONS

A new high performance fabric for HPC, Michael Feldman, May 2016, Intersect360 Research.
(Continued)

*Primary Examiner* — Zahid Choudhury
(74) *Attorney, Agent, or Firm* — Garlick & Markison; Bruce E. Stuckman; Katherine C. Stuckman

(57) ABSTRACT

A database system includes a plurality of computing devices. Each computing device includes a plurality of processing modules, a computing device operating system, and an application specific operating system. The computing device operating system includes a computing device operating system file system management instruction set. The application specific operating system includes at least one custom file system management instruction set operable to configure operation of a configurable set of processing modules of the plurality of processing modules based on generating a corresponding file system management configuration signal for each processing module of the configurable set of processing modules indicating a selected file system management instruction set of the computing device operating system or the application specific operating system.

20 Claims, 26 Drawing Sheets

Related U.S. Application Data continuation of application No. 17/237,287, filed on Apr. 22, 2021, now Pat. No. 11,615,091, which is a continuation of application No. 16/267,251, filed on Feb. 4, 2019, now Pat. No. 11,010,382.

(60) Provisional application No. 62/745,787, filed on Oct. 15, 2018.

(51) Int. Cl.

| | | |
|---|---|---|
| *G06F 7/24* | (2006.01) | |
| *G06F 9/4401* | (2018.01) | |
| *G06F 9/50* | (2006.01) | |
| *G06F 11/10* | (2006.01) | |
| *G06F 12/0893* | (2016.01) | |
| *G06F 12/109* | (2016.01) | |
| *G06F 16/17* | (2019.01) | |
| *G06F 16/22* | (2019.01) | |
| *G06F 16/23* | (2019.01) | |
| *G06F 16/242* | (2019.01) | |
| *G06F 16/2453* | (2019.01) | |
| *G06F 16/2455* | (2019.01) | |
| *G06F 16/2457* | (2019.01) | |
| *G06F 16/2458* | (2019.01) | |
| *G06F 16/27* | (2019.01) | |
| *G06F 16/901* | (2019.01) | |
| *H03M 7/30* | (2006.01) | |
| *H04L 67/10* | (2022.01) | |

(52) U.S. Cl.
CPC ............... *G06F 3/068* (2013.01); *G06F 7/24* (2013.01); *G06F 9/4406* (2013.01); *G06F 9/5016* (2013.01); *G06F 9/5027* (2013.01); *G06F 9/5061* (2013.01); *G06F 11/1004* (2013.01); *G06F 11/1044* (2013.01); *G06F 11/1076* (2013.01); *G06F 12/0893* (2013.01); *G06F 12/109* (2013.01); *G06F 16/1727* (2019.01); *G06F 16/22* (2019.01); *G06F 16/2246* (2019.01); *G06F 16/2282* (2019.01); *G06F 16/2365* (2019.01); *G06F 16/244* (2019.01); *G06F 16/2445* (2019.01); *G06F 16/2453* (2019.01); *G06F 16/24553* (2019.01); *G06F 16/24573* (2019.01); *G06F 16/2458* (2019.01); *G06F 16/278* (2019.01); *G06F 16/901* (2019.01); *G06F 16/9017* (2019.01); *H03M 7/30* (2013.01); *H04L 67/10* (2013.01); *G06F 3/067* (2013.01); *G06F 16/24547* (2019.01); *G06F 2211/1011* (2013.01); *G06F 2212/608* (2013.01)

(58) Field of Classification Search
CPC .......... G06F 16/24553; G06F 16/2282; G06F 16/2445; G06F 16/1727; G06F 16/244; G06F 16/278; G06F 16/9017; G06F 16/2365; G06F 16/2453; G06F 3/0604; G06F 3/0647; G06F 3/068; G06F 7/24; G06F 9/4406; G06F 9/5016; G06F 9/5027; G06F 9/5061; G06F 11/1004; G06F 11/1044; G06F 11/1076; G06F 12/0893; G06F 12/109; G06F 3/067; G06F 2211/1011; G06F 2212/608; H03M 7/30; H04L 67/10

See application file for complete search history.

(56) References Cited

U.S. PATENT DOCUMENTS

| | | |
|---|---|---|
| 6,466,962 B2 | 10/2002 | Bollella |
| 6,633,772 B2 | 10/2003 | Ford |
| 7,499,907 B2 | 3/2009 | Brown |
| 7,908,242 B1 | 3/2011 | Achanta |
| 10,977,128 B1 | 4/2021 | Lazier |
| 2001/0051949 A1 | 12/2001 | Carey |
| 2002/0032676 A1 | 3/2002 | Reiner |
| 2004/0162853 A1 | 8/2004 | Brodersen |
| 2006/0070067 A1 | 3/2006 | Lowery |
| 2007/0067321 A1 | 3/2007 | Bissett |
| 2008/0133456 A1 | 6/2008 | Richards |
| 2008/0222580 A1 | 9/2008 | Banerjee |
| 2009/0063893 A1 | 3/2009 | Bagepalli |
| 2009/0183167 A1 | 7/2009 | Kupferschmidt |
| 2010/0082577 A1 | 4/2010 | Mirchandani |
| 2010/0241646 A1 | 9/2010 | Friedman |
| 2010/0274983 A1 | 10/2010 | Murphy |
| 2010/0312756 A1 | 12/2010 | Zhang |
| 2011/0023026 A1 | 1/2011 | Oza |
| 2011/0219169 A1 | 9/2011 | Zhang |
| 2012/0109888 A1 | 5/2012 | Zhang |
| 2012/0151118 A1 | 6/2012 | Flynn |
| 2012/0185866 A1 | 7/2012 | Couvee |
| 2012/0227040 A1 | 9/2012 | Gounares |
| 2012/0254252 A1 | 10/2012 | Jin |
| 2012/0311246 A1 | 12/2012 | McWilliams |
| 2013/0332484 A1 | 12/2013 | Gajic |
| 2014/0047095 A1 | 2/2014 | Breternitz |
| 2014/0136510 A1 | 5/2014 | Parkkinen |
| 2014/0188841 A1 | 7/2014 | Sun |
| 2014/0365607 A1 | 12/2014 | Kikuchi |
| 2015/0205607 A1 | 7/2015 | Lindholm |
| 2015/0244804 A1 | 8/2015 | Warfield |
| 2015/0248366 A1 | 9/2015 | Bergsten |
| 2015/0293966 A1 | 10/2015 | Cai |
| 2015/0310045 A1 | 10/2015 | Konik |
| 2016/0034547 A1 | 2/2016 | Lerios |
| 2017/0168758 A1* | 6/2017 | Suzue ................. G06F 9/5016 |
| 2017/0169263 A1 | 6/2017 | Köhler |
| 2018/0012022 A1 | 1/2018 | Azam |
| 2018/0239685 A1 | 8/2018 | Byrne |
| 2020/0034193 A1 | 1/2020 | Jayaram |
| 2021/0096944 A1* | 4/2021 | Datta .................. G06F 9/4484 |
| 2021/0224121 A1 | 7/2021 | Ganti |
| 2021/0232328 A1 | 7/2021 | Richards |

OTHER PUBLICATIONS

Alechina, N. (2006-2007). B-Trees. School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy. .com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable.html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; Feb. 13, 2018; 17 pgs.

International Searching Authority; International Search Report and Written Opinion; International Application No. PCT/US2017/054784; Dec. 28, 2017; 10 pgs.

International Searching Authority; International Search Report and Written Opinion; International Application No. PCT/US2017/066145; Mar. 5, 2018; 13 pgs.

International Searching Authority; International Search Report and Written Opinion; International Application No. PCT/US2017/066169; Mar. 6, 2018; 15 pgs.

(56) References Cited

OTHER PUBLICATIONS

International Searching Authority; International Search Report and Written Opinion; International Application No. PCT/US2018/025729; Jun. 27, 2018; 9 pgs.
International Searching Authority; International Search Report and Written Opinion; International Application No. PCT/US2018/034859; Oct. 30, 2018; 8 pgs.
MapReduce: Simplified Data Processing on Large Clusters, OSDI 2004, Jeffrey Dean and Sanjay Ghemawat, Google, Inc., 13 pgs.
Rodero-Merino, L.; Storage of Structured Data: Big Table and HBase, New Trends In Distributed Systems, MSc Software and Systems, Distributed Systems Laboratory; Oct. 17, 2012; 24 pages.
Step 2: Examine the data model and implementation details, 2016, Amazon Web Services, Inc., http://docs.aws.amazon.com/amazondynamodb/latestldeveloperguide!Ti.

* cited by examiner database system 10 computing device 18 computing device 18 computing device 18 node 37 node 37 node 37 node 37 node 37 of a computing device 18 node 37 of a computing device 18 computing device 18

SELECTIVE CONFIGURATION OF FILE SYSTEM MANAGEMENT FOR PROCESSING RESOURCES OF A DATABASE SYSTEM

CROSS-REFERENCE TO RELATED APPLICATIONS

The present U.S. Utility patent application claims priority pursuant to 35 U.S.C. § 120 as a continuation of U.S. Utility application Ser. No. 18/165,462, entitled "SELECTIVE OPERATING SYSTEM CONFIGURATION OF PROCESSING RESOURCES OF A DATABASE SYSTEM", filed Feb. 7, 2023, which is a continuation of U.S. Utility application Ser. No. 17/237,287, entitled "DATABASE SYSTEM IMPLEMENTATION OF A PLURALITY OF OPERATING SYSTEM LAYERS", filed Apr. 22, 2021, issued as U.S. Pat. No. 11,615,091 on Mar. 28, 2023, which is a continuation of U.S. Utility application Ser. No. 16/267,251, entitled "COMPUTING DEVICE WITH MULTIPLE OPERATING SYSTEMS AND OPERATIONS THEREOF", filed Feb. 4, 2019, issued as U.S. Pat. No. 11,010,382 on May 18, 2021, which claims priority pursuant to 35 U.S.C. § 119(e) to U.S. Provisional Application No. 62/745,787, entitled "DATABASE SYSTEM AND OPERATION," filed Oct. 15, 2018, each of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

A computer may have two operating systems loaded into its memory. The operating systems share the resources of the computer (e.g., microprocessor, memory, user interfaces, etc.). For example, the microprocessor is instructed, it executes some operations of a first operating system when instructed and then executes some operations of a second operating system. If an operation of one operating system hangs up, it can deadlock the microprocessor such that neither operating system is able to progress.

BRIEF DESCRIPTION OF THE SEVERAL VIEWS OF THE DRAWING(S)

DETAILED DESCRIPTION OF THE INVENTION

Figure 1:
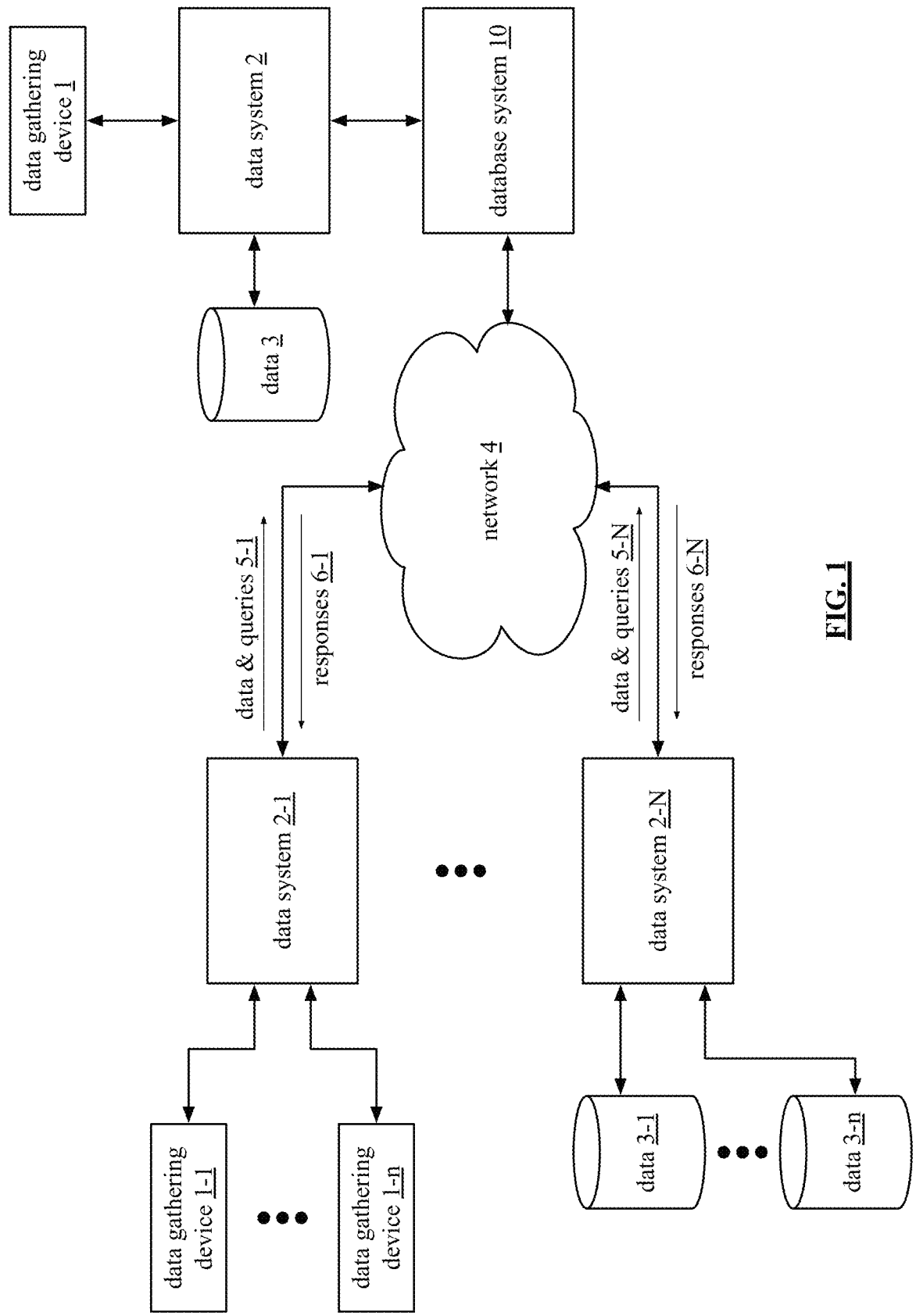
FIG. 1 is a schematic block diagram of an embodiment of a large scale data processing network that includes a database system in accordance with the present invention.

FIG. 1 is a schematic block diagram of an embodiment of a large-scale data processing network that includes data gathering devices (1, 1-1 through 1-n), data systems (2, 2-1 through 2-N), data storage systems (3, 3-1 through 3-n), a network 4, and a database system 10. The data gathering devices are computing devices that collect a wide variety of data and may further include sensors, monitors, measuring instruments, and/or other instrument for collecting data. The data gathering devices collect data in real-time (i.e., as it is happening) and provides it to data system 2-1 for storage and real-time processing of queries 5-1 to produce responses 6-1. As an example, the data gathering devices are computing in a factory collecting data regarding manufacturing of one or more products and the data system is evaluating queries to determine manufacturing efficiency, quality control, and/or product development status.

The data storage systems 3 store existing data. The existing data may originate from the data gathering devices or other sources, but the data is not real time data. For example, the data storage system stores financial data of a bank, a credit card company, or like financial institution. The data system 2-N processes queries 5-N regarding the data stored in the data storage systems to produce responses 6-N.

Data system 2 processes queries regarding real time data from data gathering devices and/or queries regarding non-real time data stored in the data storage system 3. The data system 2 produces responses in regard to the queries. Storage of real time and non-real time data, the processing of queries, and the generating of responses will be discussed with reference to one or more of the subsequent figures.

Figure 1A:
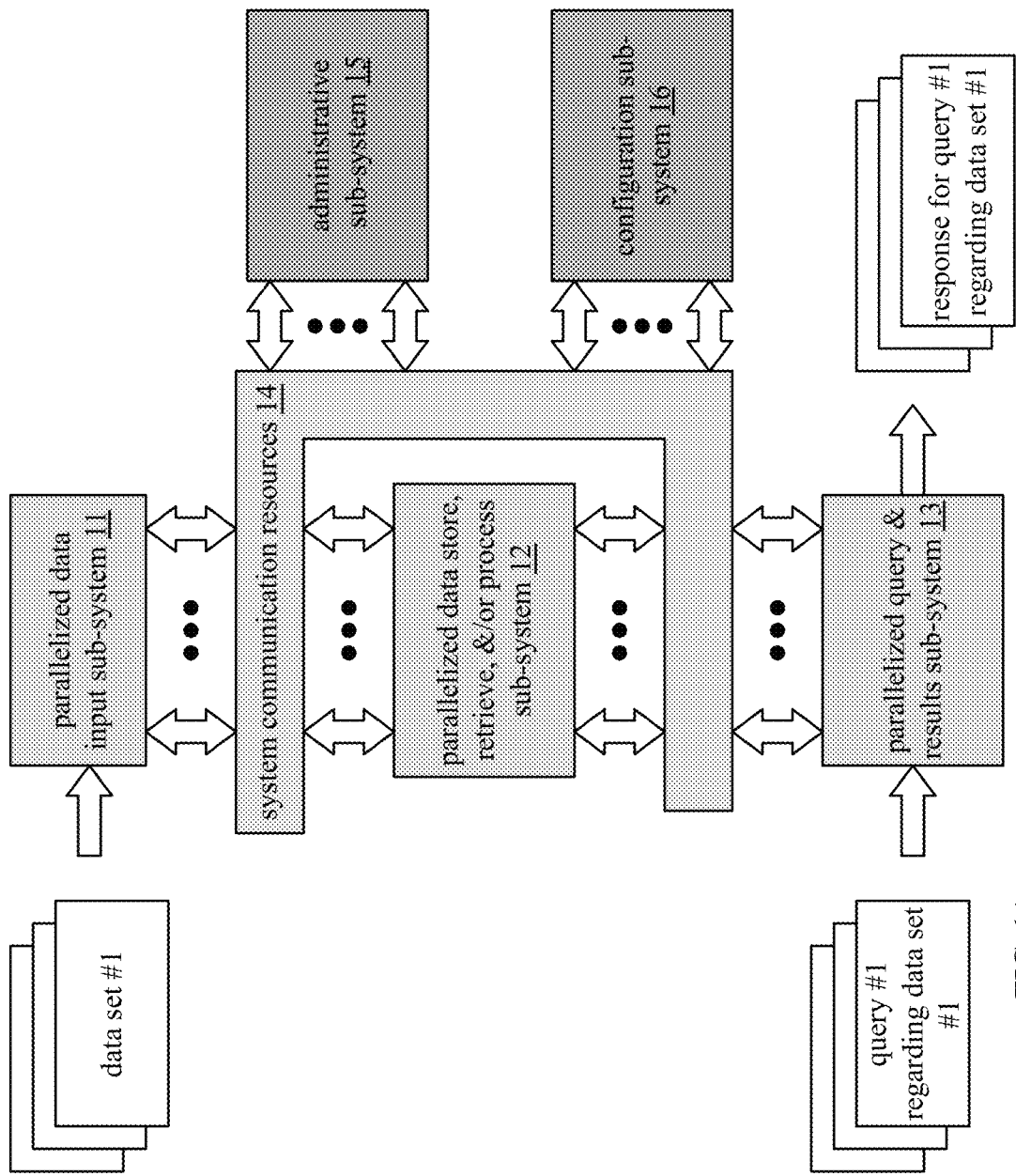
FIG. 1A is a schematic block diagram of an embodiment of a database system in accordance with the present invention.

FIG. 1A is a schematic block diagram of an embodiment of a database system 10 that includes a parallelized data input sub-system 11, a parallelized data store, retrieve, and/or process sub-system 12, a parallelized query and response sub-system 13, system communication resources 14, an administrative sub-system 15, and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together.

Each of the sub-systems 11, 12, 13, 15, and 16 include a plurality of computing devices; an example of which is discussed with reference to one or more of FIGS. 7-9. Hereafter, the parallelized data input sub-system 11 may also be referred to as a data input sub-system, the parallelized data store, retrieve, and/or process sub-system may also be referred to as a data storage and processing sub-system, and the parallelized query and response sub-system 13 may also be referred to as a query and results sub-system.

In an example of operation, the parallelized data input sub-system 11 receives a data set (e.g., a table) that includes a plurality of records. A record includes a plurality of data fields. As a specific example, the data set includes tables of data from a data source. For example, a data source includes one or more computers. As another example, the data source is a plurality of machines. As yet another example, the data source is a plurality of data mining algorithms operating on one or more computers.

As is further discussed with reference to FIG. 15, the data source organizes its records of the data set into a table that includes rows and columns. The columns represent data fields of data for the rows. Each row corresponds to a record of data. For example, a table include payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data set into a plurality of data partitions. For each partition, the parallelized data input sub-system 11 divides it into a plurality of data segments based on a segmenting factor. The segmenting factor includes a variety of approaches divide a partition into segments. For example, the segment factor indicates a number of records to include in a segment. As another example, the segmenting factor indicates a number of segments to include in a segment group. As another example, the segmenting factor identifies how to segment a data partition based on storage capabilities of the data store and processing sub-system. As a further example, the segmenting factor indicates how many segments for a data partition based on a redundancy storage encoding scheme.

As an example of dividing a data partition into segments based on a redundancy storage encoding scheme, assume that it includes a 4 of 5 encoding scheme (meaning any 4 of 5 encoded data elements can be used to recover the data). Based on these parameters, the parallelized data input sub-system 11 divides a data partition into 5 segments: one corresponding to each of the data elements).

The parallelized data input sub-system 11 restructures the plurality of data segments to produce restructured data segments. For example, the parallelized data input sub-system 11 restructures records of a first data segment of the plurality of data segments based on a key field of the plurality of data fields to produce a first restructured data segment. The key field is common to the plurality of records. As a specific example, the parallelized data input sub-system 11 restructures a first data segment by dividing the first data segment into a plurality of data slabs (e.g., columns of a segment of a partition of a table). Using one or more of the columns as a key, or keys, the parallelized data input sub-system 11 sorts the data slabs. The restructuring to produce the data slabs is discussed in greater detail with reference to FIG. 4 and FIGS. 16-18.

The parallelized data input sub-system 11 also generates storage instructions regarding how sub-system 12 is to store the restructured data segments for efficient processing of subsequently received queries regarding the stored data. For example, the storage instructions include one or more of: a naming scheme, a request to store, a memory resource requirement, a processing resource requirement, an expected access frequency level, an expected storage duration, a required maximum access latency time, and other requirements associated with storage, processing, and retrieval of data.

A designated computing device of the parallelized data store, retrieve, and/or process sub-system 12 receives the restructured data segments and the storage instructions. The designated computing device (which is randomly selected, selected in a round robin manner, or by default) interprets the storage instructions to identify resources (e.g., itself, its components, other computing devices, and/or components thereof) within the computing device's storage cluster. The designated computing device then divides the restructured data segments of a segment group of a partition of a table into segment divisions based on the identified resources and/or the storage instructions. The designated computing device then sends the segment divisions to the identified resources for storage and subsequent processing in accordance with a query. The operation of the parallelized data store, retrieve, and/or process sub-system 12 is discussed in greater detail with reference to FIG. 6.

The parallelized query and response sub-system 13 receives queries regarding tables (e.g., data sets) and processes the queries prior to sending them to the parallelized data store, retrieve, and/or process sub-system 12 for execution. For example, the parallelized query and response sub-system 13 generates an initial query plan based on a data processing request (e.g., a query) regarding a data set (e.g., the tables). Sub-system 13 optimizes the initial query plan based on one or more of the storage instructions, the engaged resources, and optimization functions to produce an optimized query plan.

For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the parallelized query and response sub-system 13 for processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, sub-query or not, and so on.

The assigned node then creates an initial query plan from the annotated abstract syntax tree. The assigned node optimizes the initial query plan using a cost analysis function (e.g., processing time, processing resources, etc.) and/or other optimization functions. Having produced the optimized query plan, the parallelized query and response sub-system 13 sends the optimized query plan to the parallelized data store, retrieve, and/or process sub-system 12 for execution. The operation of the parallelized query and response sub-system 13 is discussed in greater detail with reference to FIG. 5.

The parallelized data store, retrieve, and/or process sub-system 12 executes the optimized query plan to produce resultants and sends the resultants to the parallelized query and response sub-system 13. Within the parallelized data store, retrieve, and/or process sub-system 12, a computing device is designated as a primary device for the query plan (e.g., optimized query plan) and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan.

The primary device of the parallelized data store, retrieve, and/or process sub-system 12 provides the resulting response (e.g., resultants) to the assigned node of the parallelized query and response sub-system 13. For example, the assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query. Having received the resultants, the parallelized query and response sub-system 13 creates a response from the resultants for the data processing request.

Figure 2:
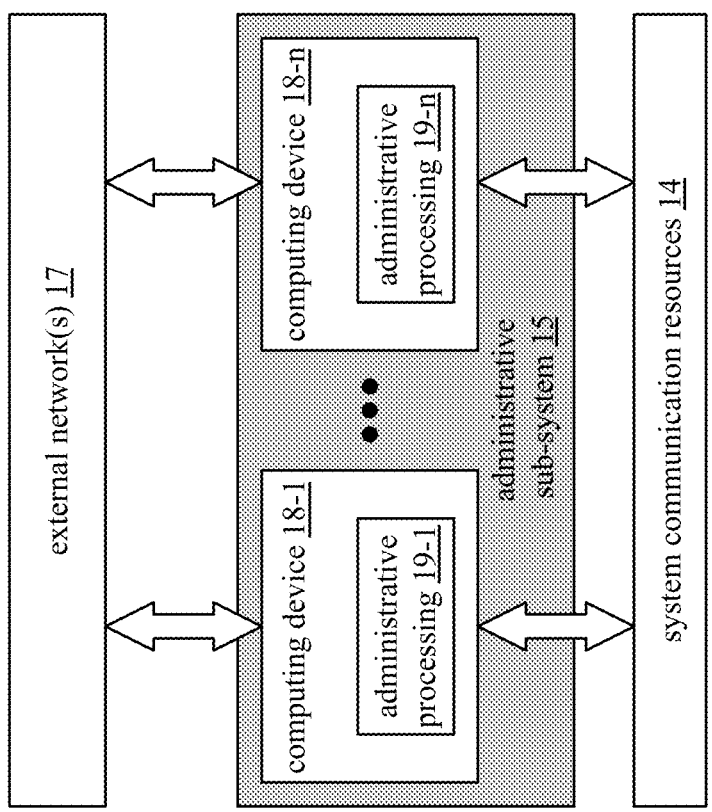
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-n. Each of the computing devices executes an administrative processing function utilizing a corresponding administrative processing of administrative processing 19-1 through 19-n (which includes a plurality of administrative operations) that coordinates system level operations of the database system.

Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

The administrative sub-system 15 functions to store metadata of the data set described with reference to FIG. 1A. For example, the storing includes generating the metadata to include one or more of an identifier of a stored table, the size of the stored table (e.g., bytes, number of columns, number of rows, etc.), labels for key fields of data segments, a data type indicator, the data owner, access permissions, available storage resources, storage resource specifications, software for operating the data processing, historical storage information, storage statistics, stored data access statistics (e.g., frequency, time of day, accessing entity identifiers, etc.) and any other information associated with optimizing operation of the database system 10.

Figure 3:
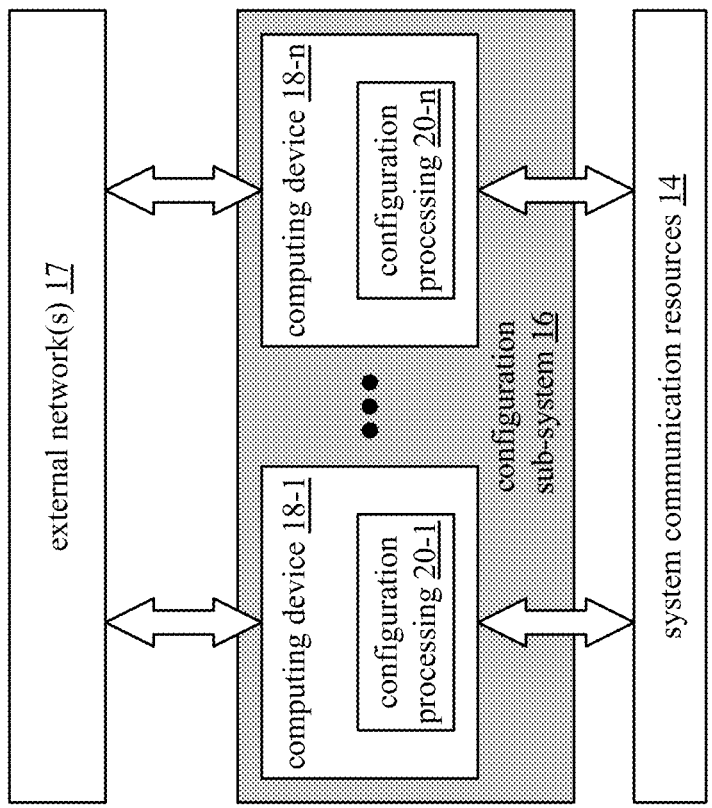
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-n. Each of the computing devices executes a configuration processing function 20-1 through 20-n (which includes a plurality of configuration operations) that coordinates system level configurations of the database system. Each computing device is coupled to the external network 17 of FIG. 2, or networks, and to the system communication resources 14 of FIG. 1A.

Figure 4:
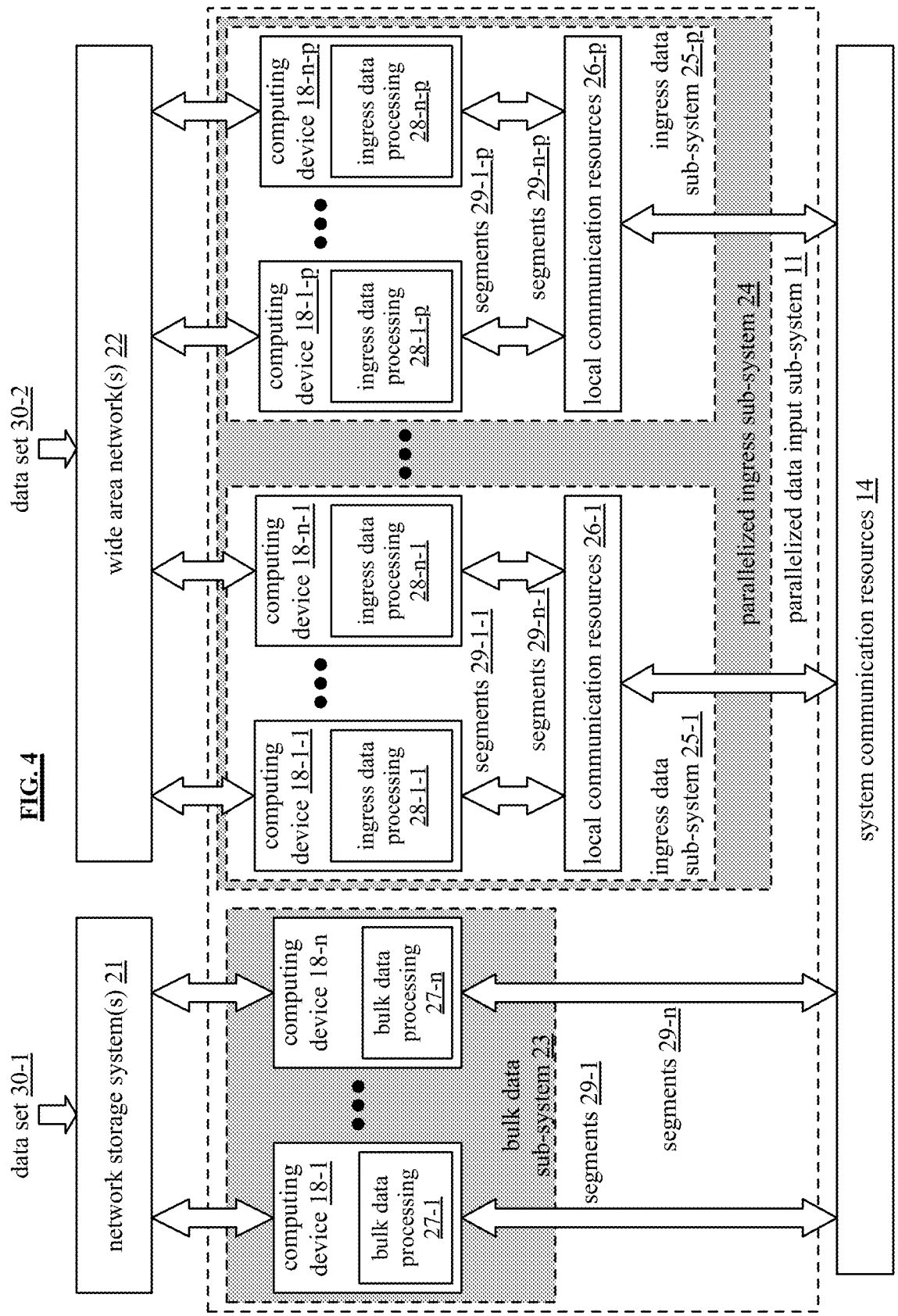
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-n. A computing device includes a bulk data processing function (e.g., 27-1) for receiving a table from a network storage system 21 (e.g., a server, a cloud storage service, etc.) and processing it for storage as generally discussed with reference to FIG. 1A.

The parallelized ingress sub-system 24 includes a plurality of ingress data sub-systems 25-1 through 25-p that each include a local communication resource of local communication resources 26-1 through 26-p and a plurality of computing devices 18-1 through 18-n. A computing device executes an ingress data processing function (e.g., 28-1) to receive streaming data regarding a table via a wide area network 22 and processing it for storage as generally discussed with reference to FIG. 1A. With a plurality of ingress data sub-systems 25-1 through 25-p, data from a plurality of tables can be streamed into the database system 10 at one time.

In general, the bulk data processing function is geared towards receiving data of a table in a bulk fashion (e.g., the table exists and is being retrieved as a whole, or portion thereof). The ingress data processing function is geared towards receiving streaming data from one or more data sources (e.g., receive data of a table as the data is being generated). For example, the ingress data processing function is geared towards receiving data from a plurality of machines in a factory in a periodic or continual manner as the machines create the data.

Figure 5:
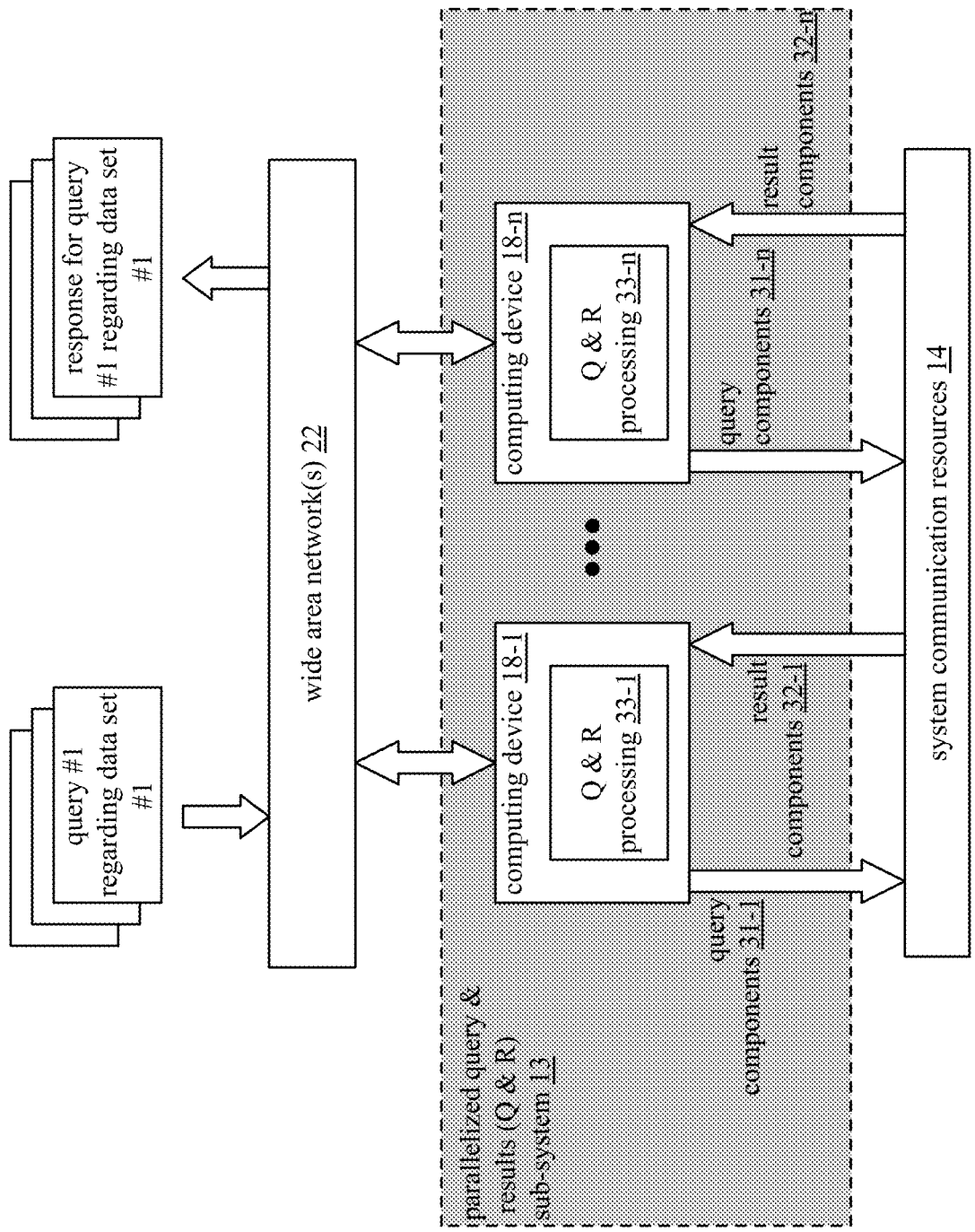
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through 18-n. Each of the computing devices executes a query (Q) & response (R) processing function 33-1 through 33-n. The computing devices are coupled to the wide area network 22 to receive queries (e.g., query no. 1 regarding data set no. 1) regarding tables and to provide responses to the queries (e.g., response for query no. 1 regarding the data set no. 1). For example, a computing device (e.g., 18-1) receives a query, creates an initial query plan therefrom, and optimizes it to produce an optimized plan. The computing device then sends components (e.g., one or more operations) of the optimized plan to the parallelized data store, retrieve, &/or process sub-system 12.

Processing resources of the parallelized data store, retrieve, &/or process sub-system 12 processes the components of the optimized plan to produce results components 32-1 through 32-n. The computing device of the Q&R sub-system 13 processes the result components to produce a query response.

The Q&R sub-system 13 allows for multiple queries regarding one or more tables to be processed concurrently. For example, a set of processing core resources of a computing device (e.g., one or more processing core resources) processes a first query and a second set of processing core resources of the computing device (or a different computing device) processes a second query.

As will be described in greater detail with reference to one or more subsequent figures, a computing device includes a plurality of nodes and each node includes multiple processing core resources such that a plurality of computing devices includes pluralities of multiple processing core resources A processing core resource of the pluralities of multiple processing core resources generates the optimized query plan and other processing core resources of the pluralities of multiple processing core resources generates other optimized query plans for other data processing requests. Each processing core resource is capable of executing at least a portion of the Q & R function. In an embodiment, a plurality of processing core resources of one or more nodes executes the Q & R function to produce a response to a query. The processing core resource is discussed in greater detail with reference to FIG. 13.

Figure 6:
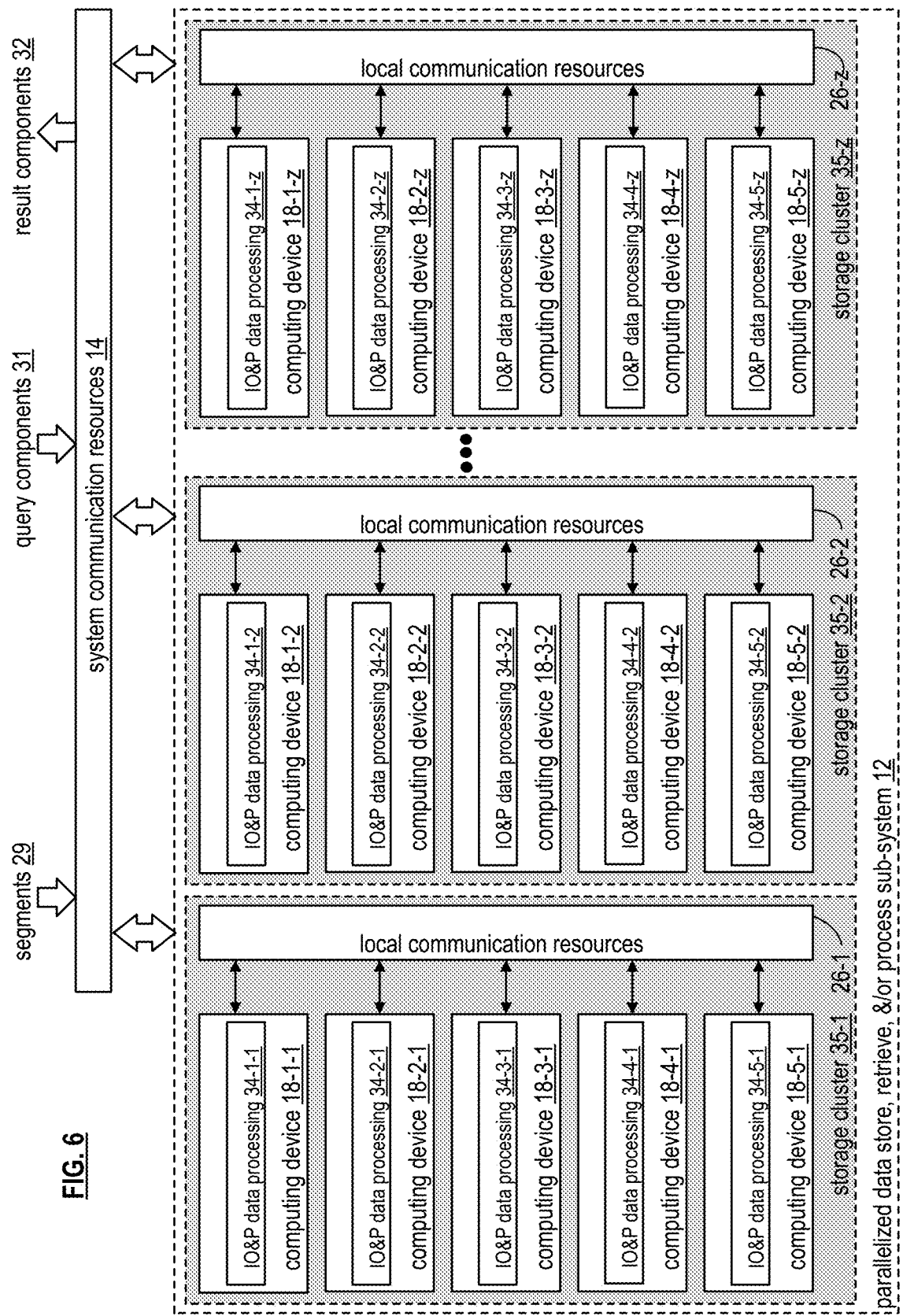
FIG. 6 is a schematic block diagram of an embodiment of a parallelized data store, retrieve, and/or process (IO& P) sub-system in accordance with the present invention.

FIG. 6 is a schematic block diagram of an embodiment of a parallelized data store, retrieve, and/or process sub-system 12 that includes a plurality of computing devices, where each computing device includes a plurality of nodes and each node includes multiple processing core resources. Each processing core resource is capable of executing at least a portion of the function of the parallelized data store, retrieve, and/or process sub-system 12. The plurality of computing devices is arranged into a plurality of storage clusters. Each storage cluster includes a number of computing devices.

In an embodiment, the parallelized data store, retrieve, and/or process sub-system 12 includes a plurality of storage clusters 35-1 through 35-z. Each storage cluster includes a corresponding local communication resource 26-1 through 26-z and a number of computing devices 18-1 through 18-5. Each computing device executes an input, output, and processing (IO &P) processing function 34-1 through 34-5 to store and process data.

The number of computing devices in a storage cluster corresponds to the number of segments (e.g., a segment group) in which a data partitioned is divided. For example, if a data partition is divided into five segments, a storage cluster includes five computing devices. As another example, if the data is divided into eight segments, then there are eight computing devices in the storage clusters.

To store a segment group of segments 29 within a storage cluster, a designated computing device of the storage cluster interprets storage instructions to identify computing devices (and/or processing core resources thereof) for storing the segments to produce identified engaged resources. The designated computing device is selected by a random selection, a default selection, a round-robin selection, or any other mechanism for selection.

The designated computing device sends a segment to each computing device in the storage cluster, including itself. Each of the computing devices stores their segment of the segment group. As an example, five segments 29 of a segment group are stored by five computing devices of storage cluster 35-1. The first computing device 18-1-1 stores a first segment of the segment group; a second computing device 18-2-1 stores a second segment of the segment group; and so on. With the segments stored, the computing devices are able to process queries (e.g., query components from the Q&R sub-system 13) and produce appropriate result components.

While storage cluster 35-1 is storing and/or processing a segment group, the other storage clusters 35-2 through 35-n are storing and/or processing other segment groups. For example, a table is partitioned into three segment groups. Three storage clusters store and/or process the three segment groups independently. As another example, four tables are independently storage and/or processed by one or more storage clusters. As yet another example, storage cluster 35-1 is storing and/or processing a second segment group while it is storing/or and processing a first segment group.

Figure 7:
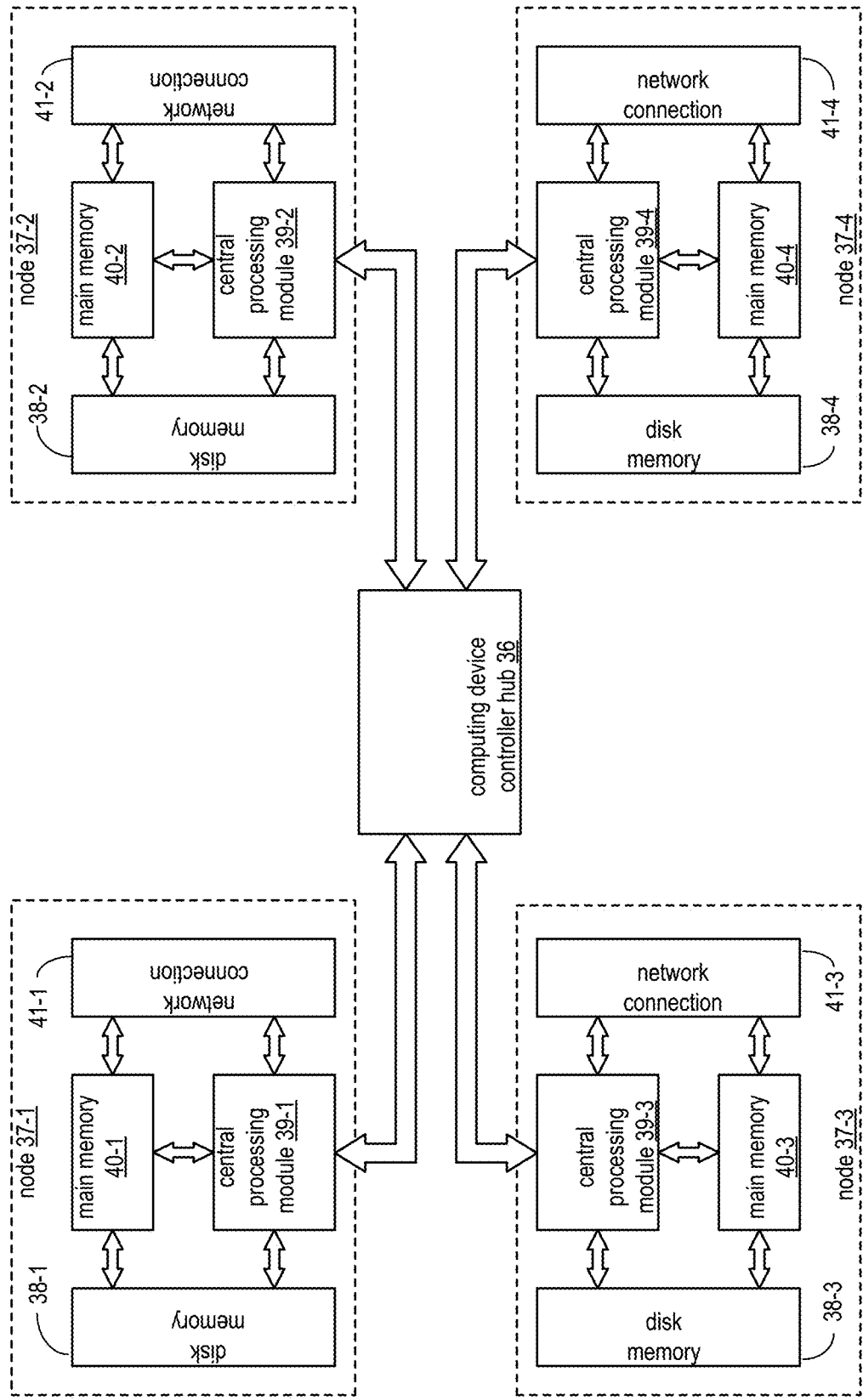
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub 36. The computing device controller hub 36 includes one or more of a chipset, a quick path interconnect (QPI), and an ultra path interconnection (UPI). Each node 37-1 through 37-4 includes a central processing module 39-1 through 39-4, a main memory 40-1 through 40-4 (e.g., volatile memory), a disk memory 38-1 through 38-4 (non-volatile memory), and a network connection 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
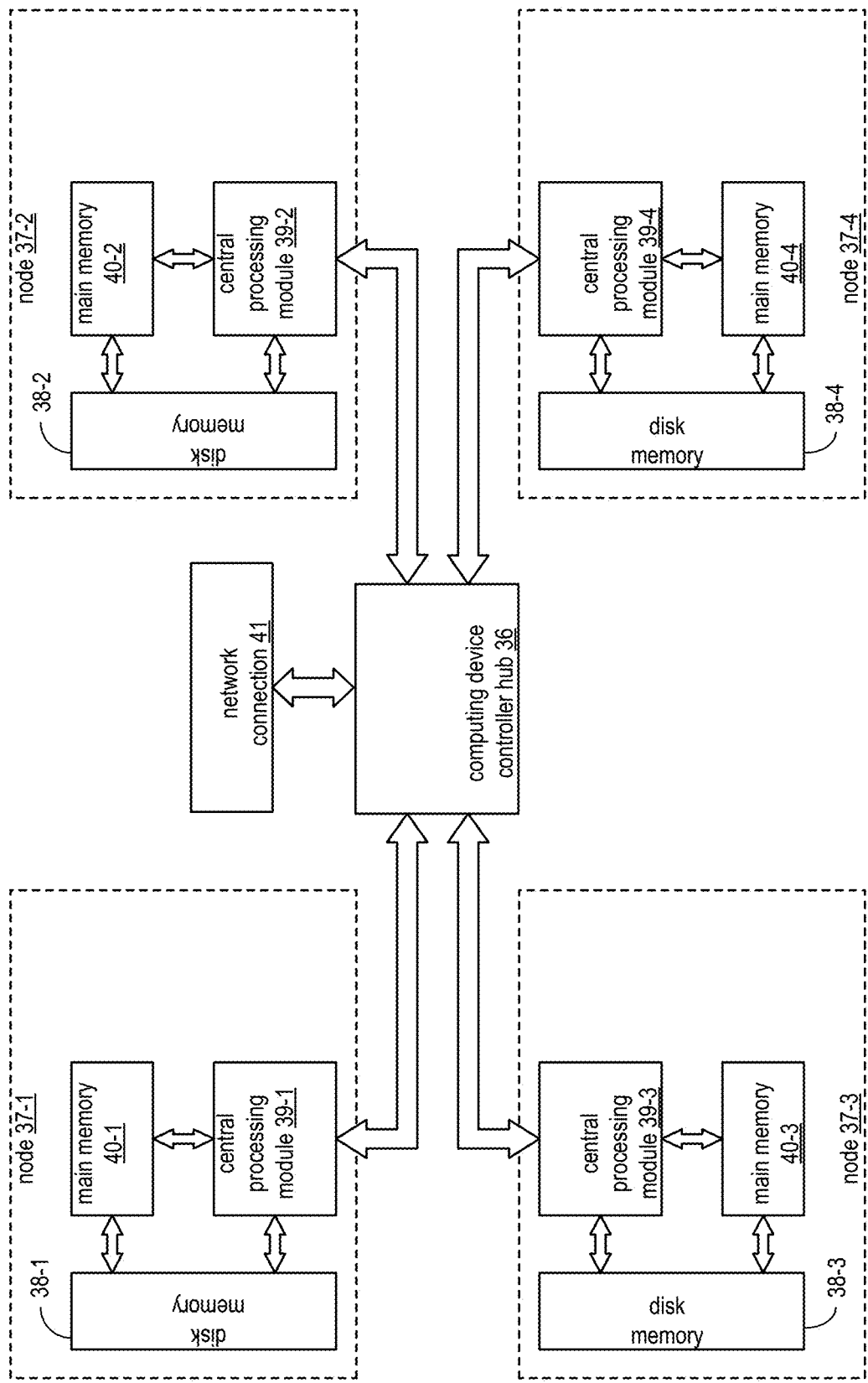
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
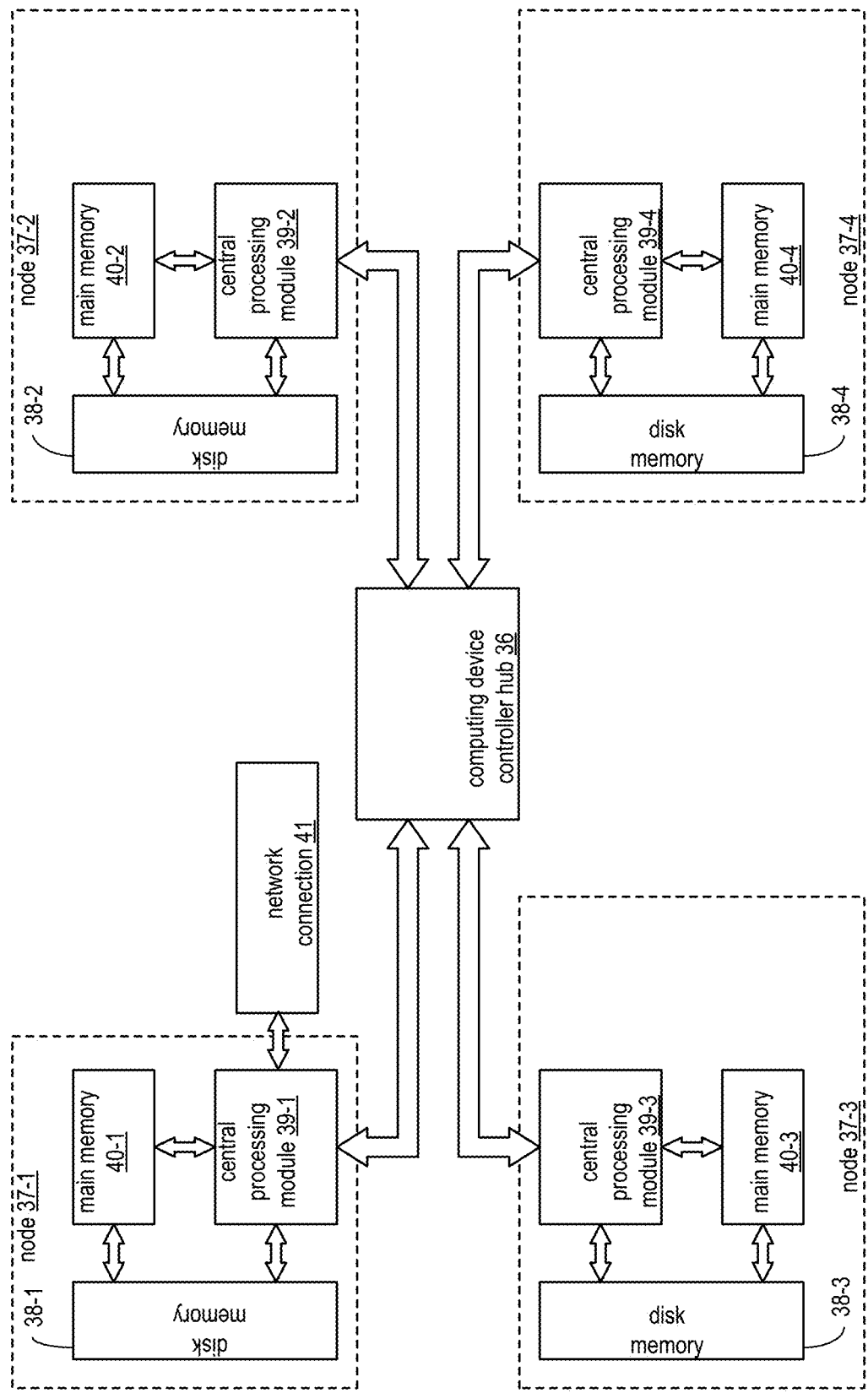
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 39-1 of node 37-1). As such, each node coordinates with the central processing module via the computing device controller hub 36 to transmit or receive data via the network connection.

Figure 10:
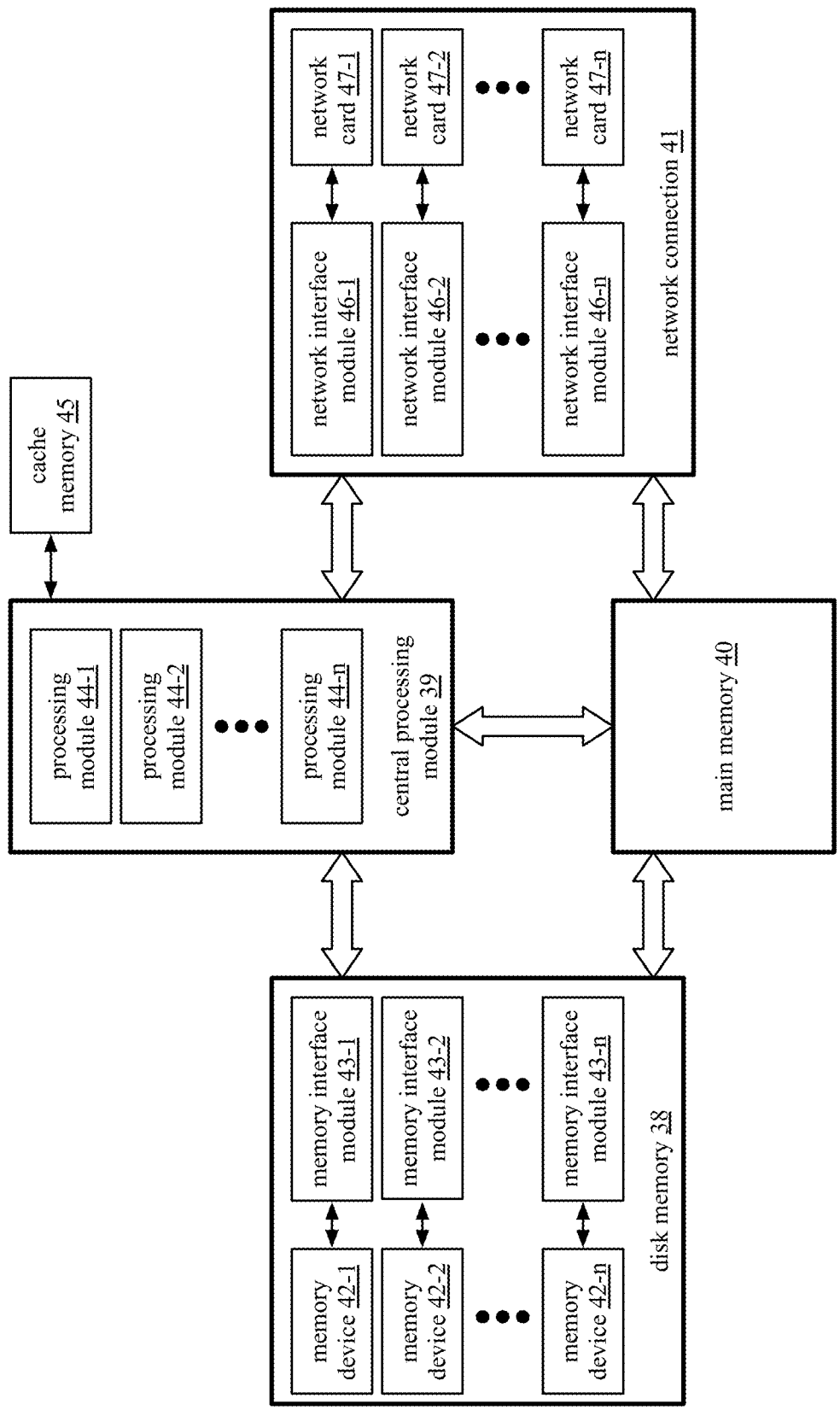
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-n and an associated one or more cache memory 45. A processing module is as defined at the end of the detailed description.

The disk memory 38 includes a plurality of memory interface modules 43-1 through 43-n and a plurality of memory devices 42-1 through 42-n (e.g., non-volatile memory). The memory devices 42-1 through 42-n include, but are not limited to, solid state memory, disk drive memory, cloud storage memory, and other non-volatile memory. For each type of memory device, a different memory interface module 43-1 through 43-n is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-n and a plurality of network cards 47-1 through 47-n. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-n include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
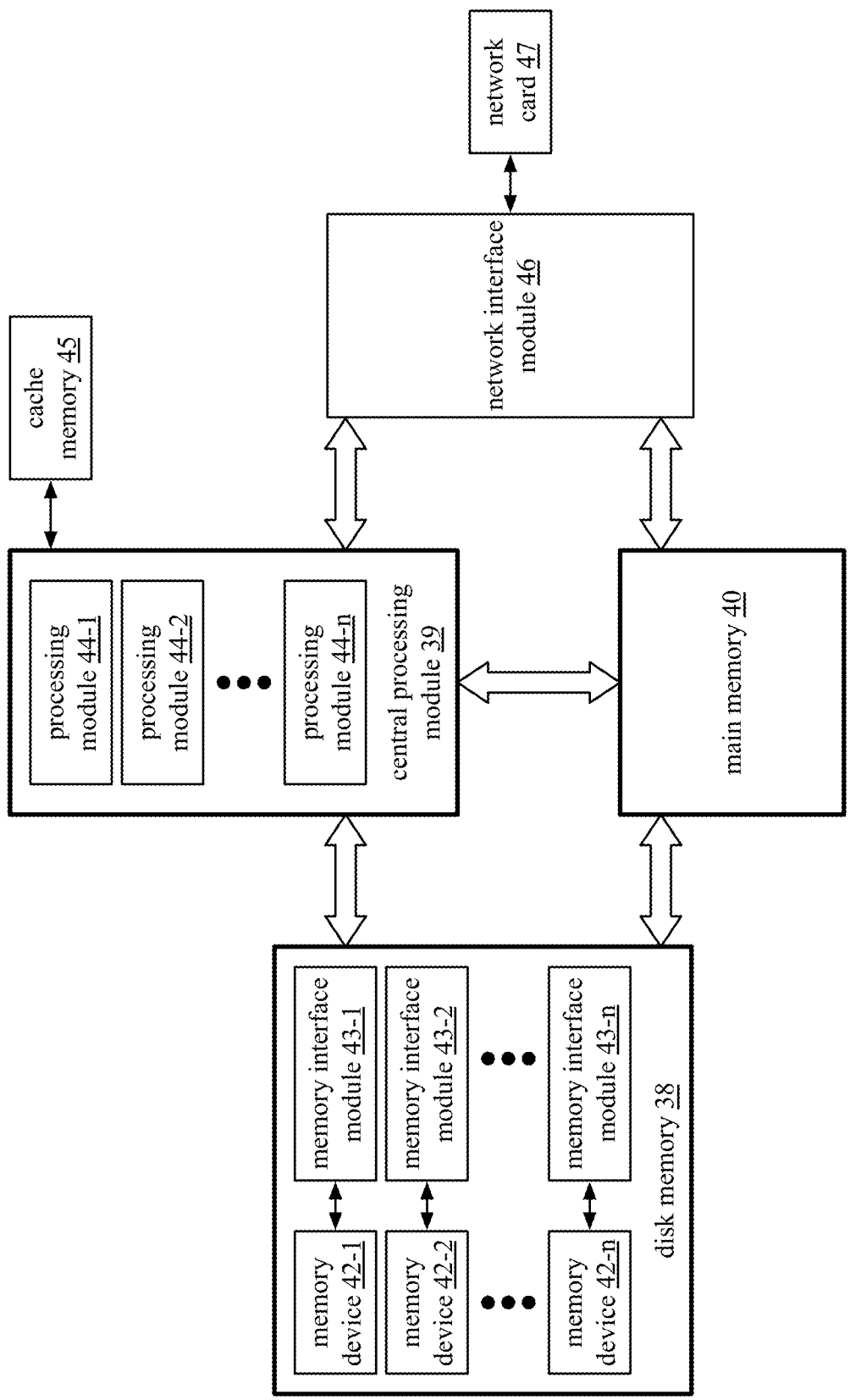
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and corresponding network card 47 configuration.

Figure 12:
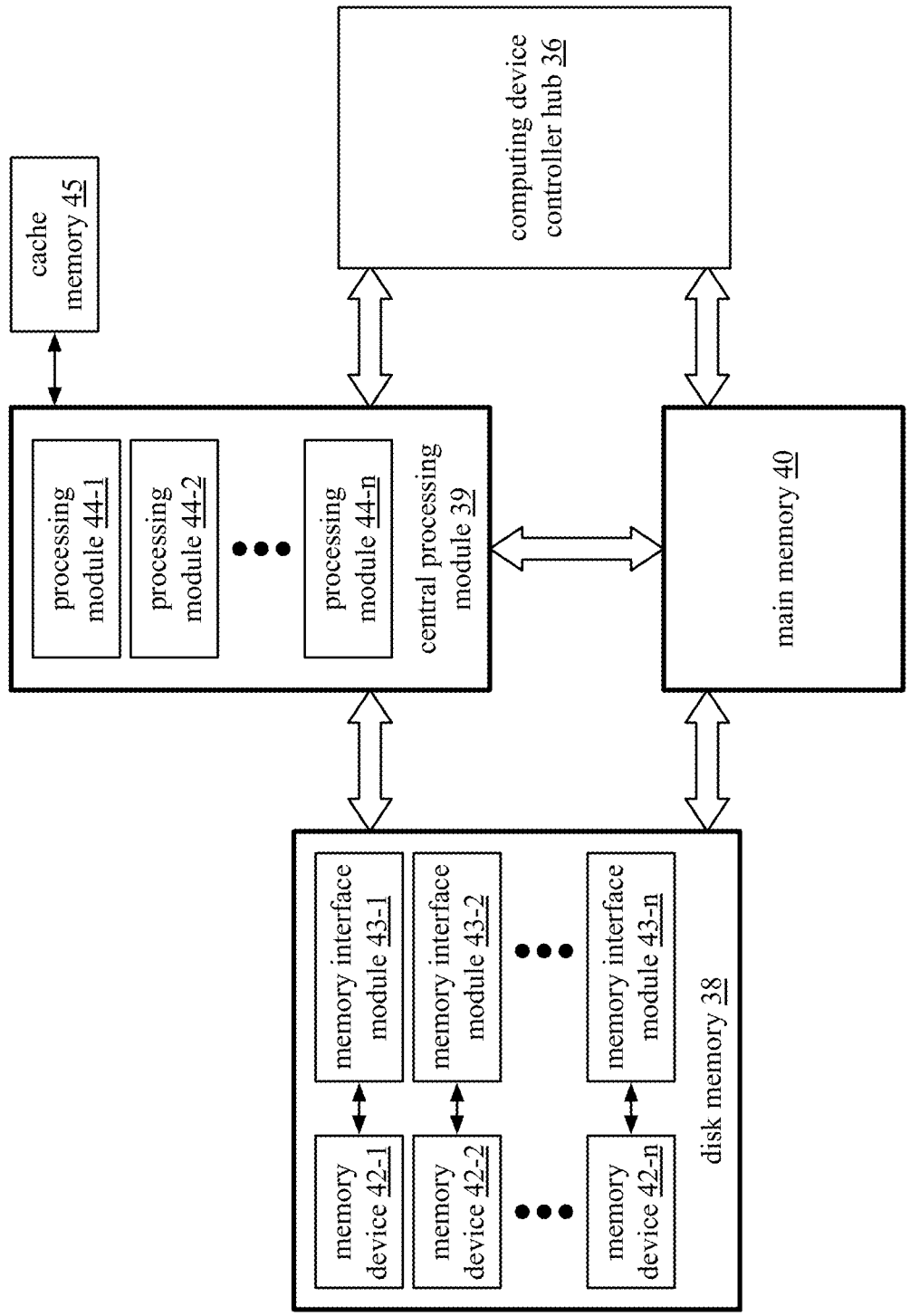
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
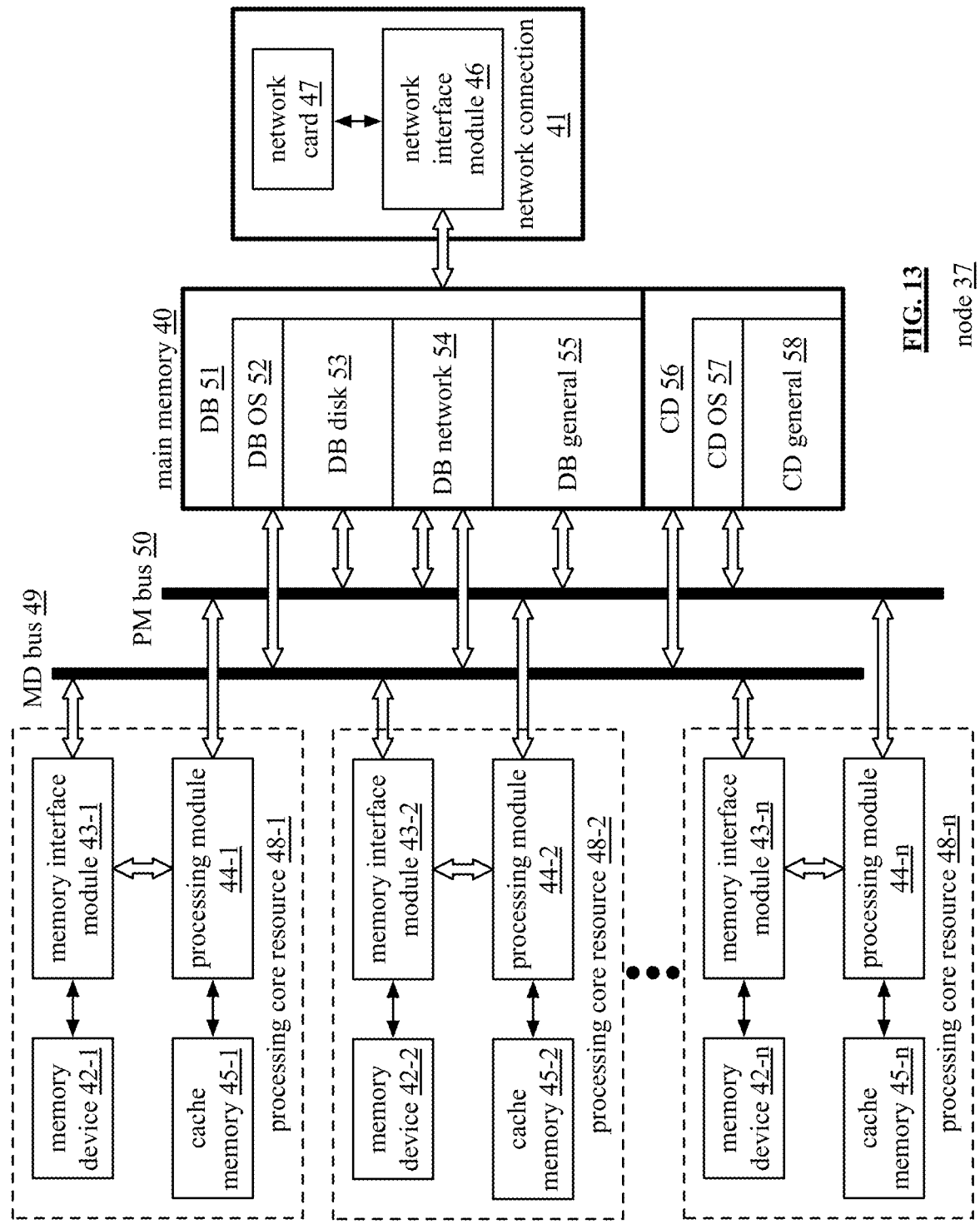
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource 48 includes a corresponding processing module 44-1 through 44-n, a corresponding memory interface module 43-1 through 43-*n*, a corresponding memory device 42-1 through 42-*n*, and a corresponding cache memory 45-1 through 45-*n*. In this configuration, each processing core resource can operate independently of the other processing core resources. This further supports increased parallel operation of database functions to further reduce execution time.

The main memory 40 is divided into a computing device (CD) 56 section and a database (DB) 51 section. The database section includes a database operating system (OS) area 52, a disk area 53, a network area 54, and a general area 55. The computing device section includes a computing device operating system (OS) area 57 and a general area 58. Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
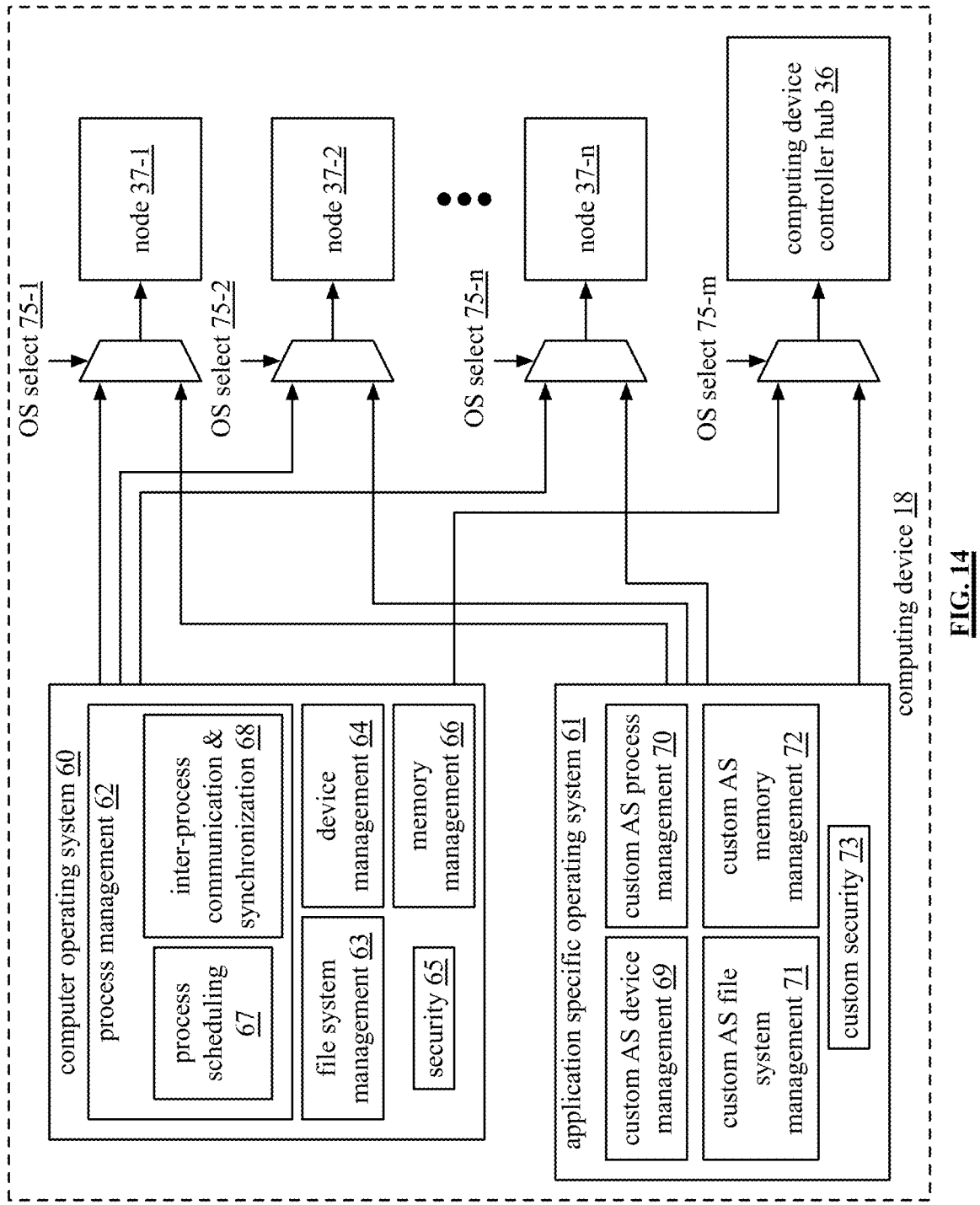
FIG. 14 is a schematic block diagram of an embodiment of operating systems of a computing device in accordance with the present invention.

FIG. 14 is a schematic block diagram of an embodiment of operating systems of a computing device 18. From a hardware perspective, the computing device 18 includes a plurality of nodes 37 and a computing device controller hub 36. From a software perspective, the computing device 18 includes a computer operating system 60 and an application specific overriding operating system (DB OS) 61. The computer OS 60 includes process management 62, file system management 63, device management 64, memory management 66, and security 65. The processing management 62 generally includes process scheduling 67 and inter-process communication and synchronization 68. In an embodiment, the computer OS 60 is a conventional operating system used by a variety of types of computing devices. For example, the computer operating system is a personal computer operating system, a server operating system, a tablet operating system, a cell phone operating system, etc.

The application specific (AS) operating system (DB OS) 61 includes custom AS device management 69, custom AS process management 70 (e.g., process scheduling and/or inter-process communication & synchronization), custom AS file system management 71, custom AS memory management 72, and/or custom security 73. In an embodiment, the AS OS 61 provides an operating system that optimizes the use of the hardware components of a computing device (e.g., nodes, processing core resources, etc.) for a specific application. For example, the specific application is a database application, in which, the computing device (or plurality of computing devices) process a large amount of data to produce responses to queries.

To efficiently process queries, the application specific operating system 61 includes a plurality of operations. The operations include: a custom AS memory management 72 instruction set (e.g., one or more operational instructions) that provide direct access to the main volatile memory for the processing modules, the network interface modules, and/or the memory interface modules of a node; a file system management 71 instruction set that enable fast and efficient storage of data; a device management 69 instruction set that enables nodes and/or processing core resources to operate independently; and/or a process management 70 instruction set that facilitates the independent operation of the nodes and/or processing cores and further coordinates processing of threads by individual nodes and/or individual processing core resources.

In an example of operation, the application specific OS 61 controls which operations from which operating systems the nodes 37 and the controller hub 36 will execute to support their various user applications (e.g., database instruction sets for storing data, manipulating data, receiving and processing queries, and/or generating responses to queries). For example, the application specific operating system 61 determines that node 37-1 will execute the operations of the computer operating system 60. As such, node 37-1 functions as a generic computer to handle general computing function operations.

As another example, the application specific (AS) operating system 60 selects one or more of its operations to produce a selected operating system for use by another node (e.g., node 37-2). As a specific example, the AS operating system 60 selects the application specific file system management instruction set 69; the application specific memory management instruction set 72; and the application specific process management instruction set 70 from its operations and selects the device management instruction set 64 from the computer operating system 60.

As further example, the application specific (AS) operating system 60 selects one or more of its operations to produce a second selected operating system for use by yet another node (e.g., node 37-*n*). As a specific example, the AS operating system 60 selects the application specific file system management instruction set 69; the application specific memory management instruction set 72; and the application specific process management instruction set 70 from its operations and selects the device management instruction set 64 from the computer operating system 60.

The AS operating system 61 enables the selected operating system by overriding corresponding operations of the computer operating system. For example, when the selected operating system includes the application specific file system management instruction set 69, it overrides the file system management instruction set 63 of the computer operating system 60 for each node that the selected operating system is engaged. In addition, the computer operating system 60 ignores file system matters for the node, or nodes, for which the selected operating system is engaged.

To override an operation of the computer OS 60, the AS OS 61 provides instructions to the computer OS 60 regarding which operations (e.g., file system, process management, device management, scheduling, and/or memory management) will be controlled by operations of the AS OS 61. When an operation of the computer operating system is overridden, the corresponding node or processing core resource ignores instructions from the operation and/or the operation treats the node or processing core resource as if it does not exist.

As used herein, an instruction set includes operational instructions to perform one or more algorithmic functions. For example, the file system management instruction set 63 includes operational instructions to enable a computer to create directories, name files, specify partitions, delete files, delete directories, edit file names, edit directories, filing locking, and/or access control. As another example, the process scheduling instruction set 67 includes operational instructions to enable a computer to process and/or thread scheduling; swapping processes in and out of memory; dispatching a processing module to a process that is loaded in main memory and ready to run; and/or coordinate process state transitions between a hold state, a ready state, a blocked state, a running state, a terminated state, a swapped ready state, and a swapped blocked state; queuing data and/or operational instructions.

As yet another example, the inter-process communication and synchronization instruction set 68 includes operational instructions that enable a computer to data sharing between processes; process synchronization; interrupt processing; and/or deadlock avoidance. As a further example, the device management instruction set 64 includes operational instructions that enable a computer to control access to input and output interface modules by peripheral devices, input devices, and/or output devices; control access to memory devices via non-volatile memory interface modules; process device interrupt requests; process direct memory access (DMA); and control network interface access and communication.

As a still further example, the memory management instruction set 66 includes operational instructions that enable a computer to partitioning of memory for multiprogramming operation; to read and store data into fixed size pages from memory; to manage page tables; to segment a program into variable sized segment; to manage segmenting tables; and to swap data between memory devices.

Since a computer is intended to handle a wide variety of computer programs, the computer operating system is designed accommodate a wide variance in operating system support. As such, the computing operating system is not optimized for specific computer functionality. The application specific operating system 61 is optimized for a specific computing function (e.g., database operation, real time data processing, etc.).

In particular, parallel and independent operation of nodes and/or processing core resources of a computing device dramatically improves the efficiency in performing database operations. Further, efficiencies are obtained by provided direct memory access to the main volatile memory for the network interface modules and for the memory interface modules. Even greater efficiencies can be obtained by allocating a portion of the main volatile memory for buffering network data in a format consistent with network data communicated via the network interface modules (e.g., 1 Mega-Byte or larger data blocks). Still further efficiencies can be obtained by allocating a portion of the main volatile memory for buffering memory data in a format consistent with data communicated via the memory interface modules (e.g., 4 Kilo-Byte or larger data blocks).

Figure 15:
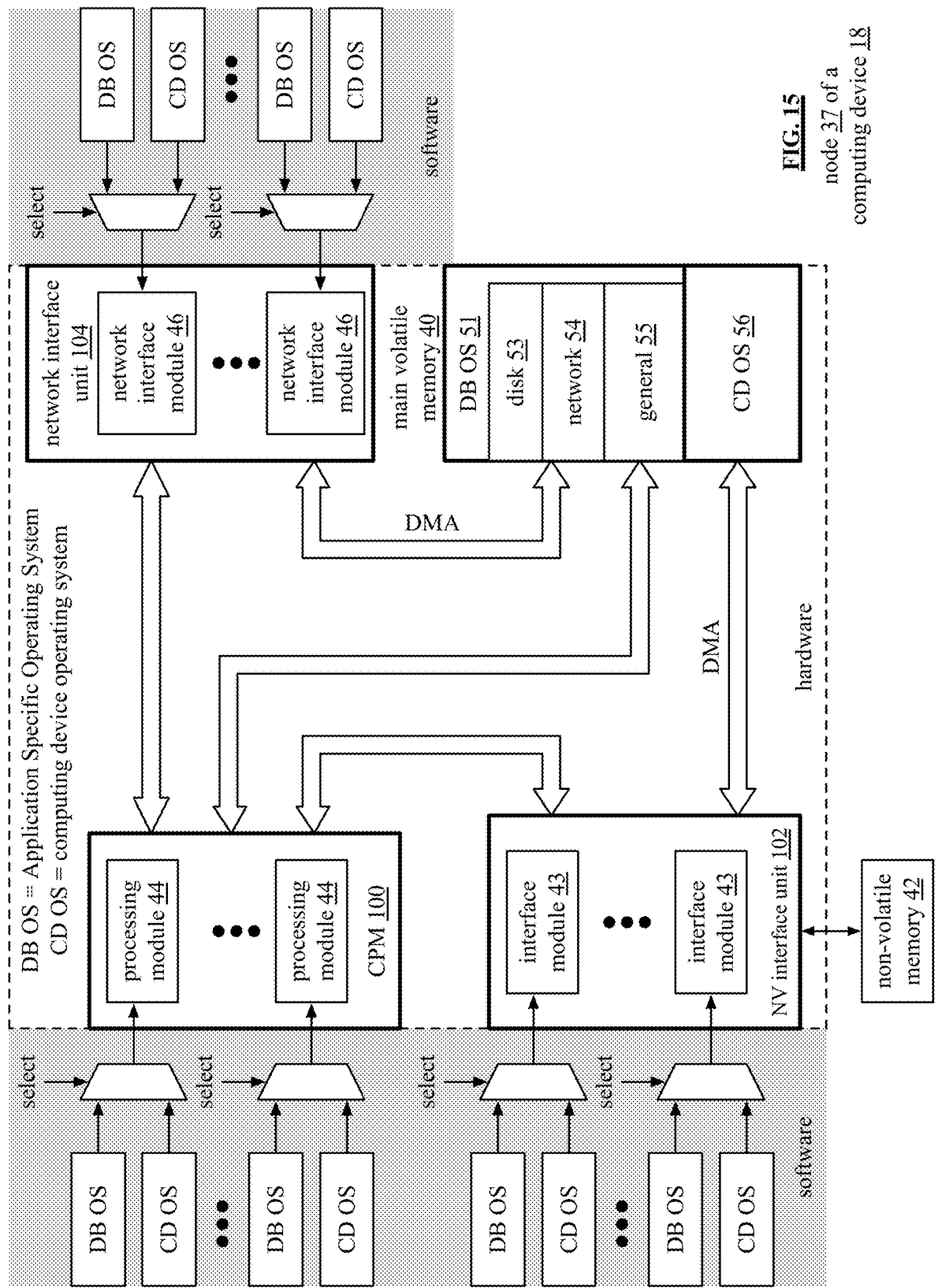
FIG. 15 is a schematic block diagram of another embodiment of a node of a computing device in accordance with the present invention.

FIG. 15 is a schematic block diagram of an embodiment of operating systems for a node 37 of a computing device 17. The node 37 includes hardware and software architectures. The software architecture includes a computing device operating system (CD OS), an application specific operating system (DB OS), and a plurality of software applications (not shown). The hardware architecture includes non-volatile memory 42, a centralized processing module unit (CPM) 100, main volatile memory 40 (which is shared by the nodes of the computing device), and a network interface unit 104 (which could be dedicated to the node or shared by the nodes of the computing device).

The non-volatile memory includes a plurality of memory devices. A memory device is a non-volatile memory of a variety of forms. For example, a memory device is a solid-state memory such as flash memory (NAND or NOR flash). The centralized processing module unit (CPM) 100 includes a plurality of processing modules 44. A processing module 44 is defined at the end of the detailed description section. If the node 37 includes its own network connection, the network connection includes one or more network interfaces 46 and corresponding network cards (which are not shown).

Within the hardware section of a node 37, the centralized processing module unit (CPM) 100 has direct connections with the non-volatile (NV) interface unit 102, with the main volatile memory 40, and with the network interface unit 104. Also within the hardware section, each of the NV memory interface unit 102 and the network interface unit has direct memory access (DMA) with the main volatile memory 40.

The software architecture allows individual selection of one of the operating systems, or operations thereof, for use by the centralized processing module unit (CPM), the NV memory interface unit 102, and/or the network interface unit 104. Further, within each of these hardware sections, the desired operating system is selectable at the component level. For example, a first processing module uses the computing device operating system (CD OS) and a second processing module uses the database operating system (DB OS).

Figure 16:
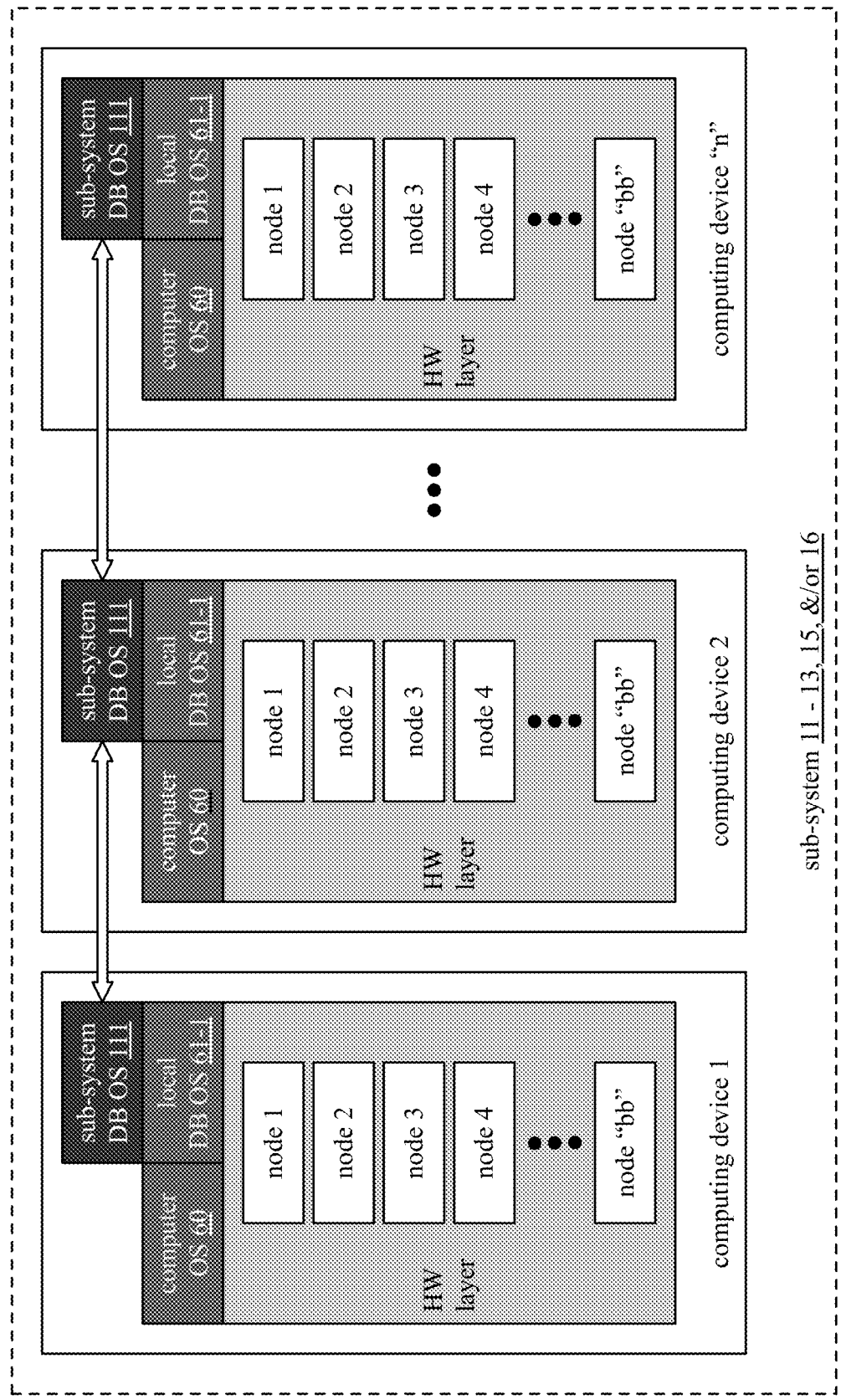
FIG. 16 is a schematic block diagram of an embodiment of a sub-system of computing devices in accordance with the present invention.

FIG. 16 is a schematic block diagram of an embodiment of operating systems of a sub-system 11-13, 15, and/or 16 of the database system 10. The sub-system (e.g., the parallelized data input sub-system 11, the parallelized store, retrieve, and/or process sub-system 12, the parallelized query & results sub-system 13, the administrative sub-system 15, and/or the configuration sub-system 16) includes a plurality of computing devices. Each computing device includes a hardware (HW) layer and multiple operating system layers. The HW layer includes a plurality of nodes as previously discussed. The operating system layers include the computing device operating system (CD OS) 60, a local database operating system (DB OS) 61-1 (e.g., a specific embodiment of an application specific operating system), and a sub-system database operating system (DB OS) 111.

The computing devices utilize the computing device operating system (CD OS) 60 as previously discussed. The computing devices use the local database operating system (DB OS) 61-1 and the sub-system database operating system (DB OS) 111 to support one or more database instruction sets. As an example of a database instruction set, the instruction set is regarding the organization and storage of records of a table. As another example of a database instruction set, the instruction set is regarding optimizing a query to produce an optimized query plan. As yet another example of a database instruction set, the instruction set is regarding executing of an optimized query plan in accordance with the organization and storage of the records of the table.

The nodes of each computing device utilize the local DB OS 61-1 to facilitate the execution of database specific operations. As discussed with reference to one or more of FIGS. 14 and 15, the local DB OS 61-1 includes application specific device management 69, application specific memory management 72, application specific processing management 70, application specific scheduling (as part of process management 70), and application specific file system management 71.

While the local DB OS 61-1 enables a node, and/or its processing core resources, to function independently of other nodes, the sub-system 11-13, 15, and/or 16, as a whole, functions in accordance with the sub-system DB OS 111 to execute a sub-system operation. For example, when the database system 10 is loading a table by sub-system 11, one or more computing devices and their collective nodes work in concert to load the table. Node of one or more computing devices does its part to the load the table in accordance with the local DB OS 61-1 and the nodes coordinate their parts in accordance with the sub-system DB OS 111.

The sub-system DB OS 111 includes instruction sets for sub-system level file system management, device management, process management (e.g., process scheduling and/or inter-process communication and synchronization), memory management, and/or security. The sub-system DB OS 111 enables sub-system level applications to execute on the resources of the sub-system (e.g., the computing devices, their nodes, and/or their processing core resources). For example, the sub-system DB OS 111 runs on each of the computing devices and they coordinate or share operating responsibilities for the sub-system.

As a specific example, the parallelized store, retrieve, and/or process sub-system 12 is supporting a variety of applications (e.g., storing two different tables and executing three different queries). In this instance, the sub-system DB OS 111 allocates resources (e.g., computing devices, their nodes, and/or their processing core resources) to the various applications in accordance with a device management instruction set and/or a process management instruction set. As new applications are received, and/or as existing applications are completed, the sub-system DB OS 111 adjusts device management, process management, memory management, and/or file system management.

Figure 17:
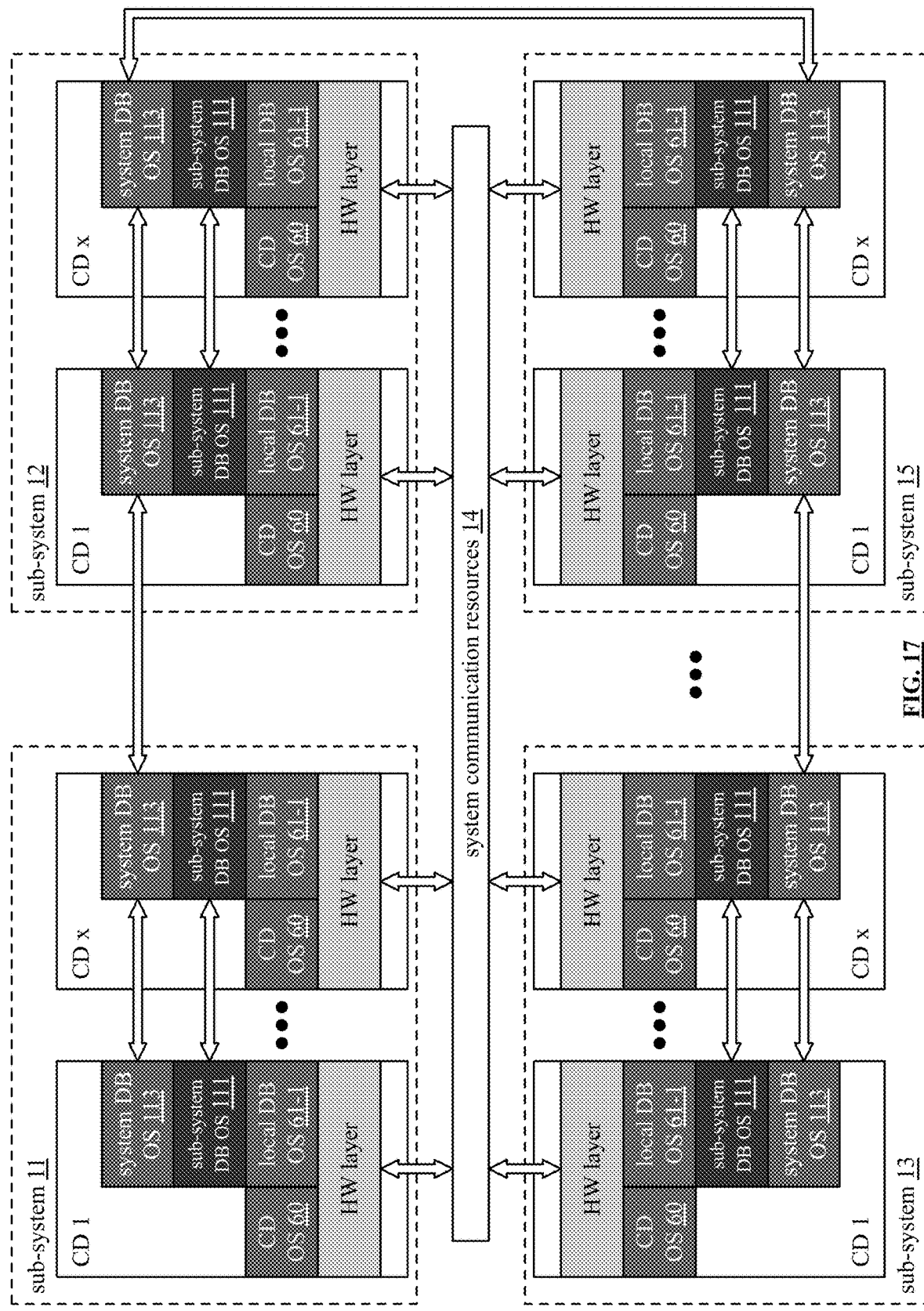
FIG. 17 is a schematic block diagram of an embodiment of a plurality of sub-systems, each including computing devices in accordance with the present invention.

FIG. 17 is a schematic block diagram of an embodiment of the database system 10 that includes the parallelized data input sub-system 11, the parallelized store, retrieve, and/or process sub-system 12, the parallelized query & results sub-system 13, the administrative sub-system 15. FIG. 17 builds on the embodiment of FIG. 16 by adding a system level database operating system layer 113.

While the local DB OS 61-1 and the sub-system DB OS 111 enables computing devices, their nodes, and/or their processing core resources, to collectively function as an independent sub-system 11-13, 15, and/or 16, the system 10, as a whole, functions in accordance with the system DB OS 113 to execute a system operation. For example, when the database system 10 is loading a table in real-time, executing a query on the table in real-time, and producing query responses in real-time, the sub-systems work in concert. Nodes of one or more computing devices of a sub-system does their respective parts of the system operation in accordance with the local DB OS 61-1 coordinate their parts in accordance with the sub-system DB OS 111, and the sub-systems coordinate their parts in accordance with the system DB OS 113.

The system DB OS 113 includes instruction sets for system level file system management, device management, process management (e.g., process scheduling and/or inter-process communication and synchronization), memory management, and/or security. The system DB OS 113 enables system level applications to execute on the resources of the system (e.g., one or more sub-systems and the computing devices, nodes, and/or their processing core resources thereof). For example, the system DB OS 113 runs on each of the computing devices and they coordinate or share operating responsibilities for the system.

Figure 18:
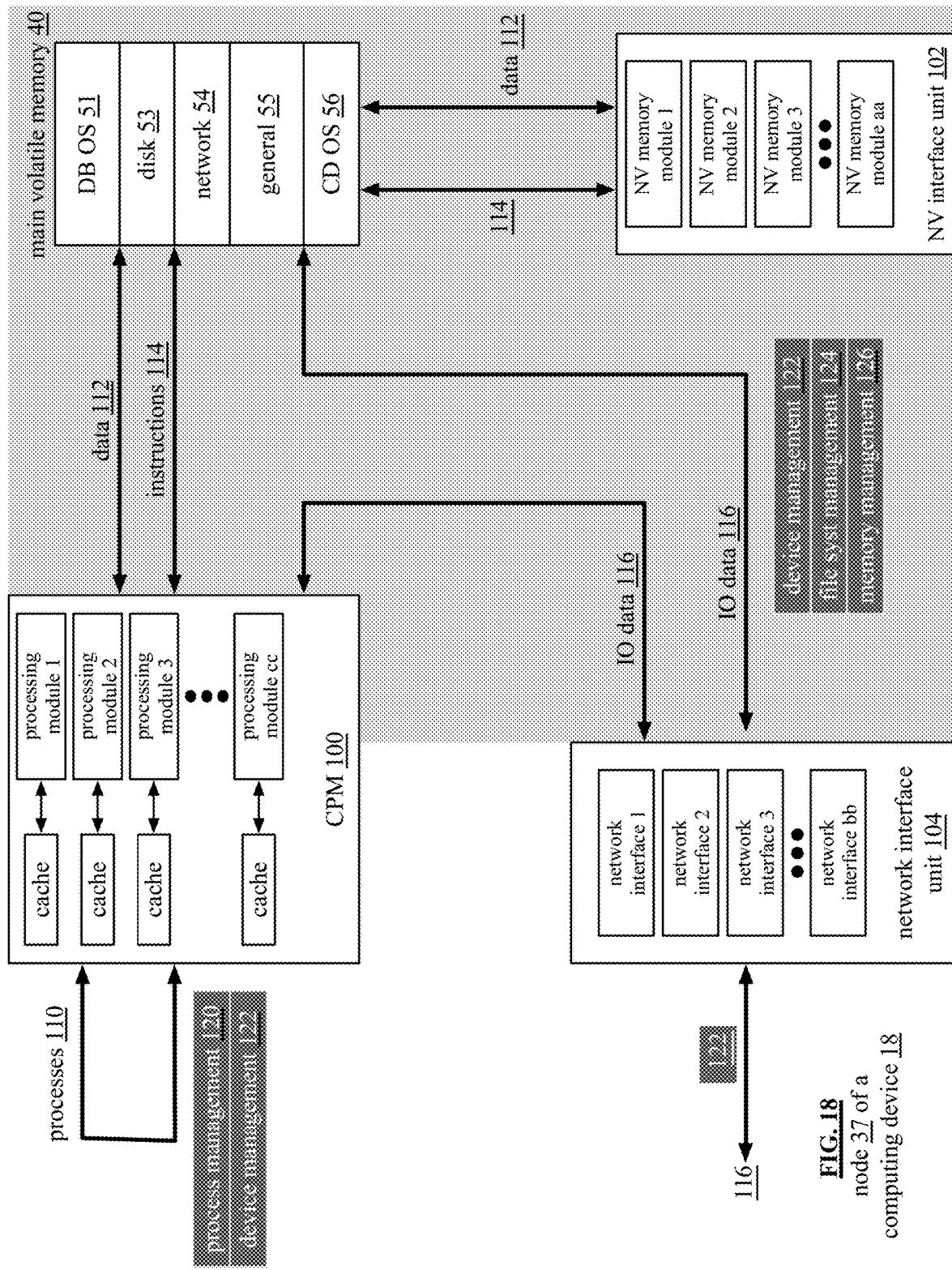
FIG. 18 is a schematic block diagram of an embodiment of an application specific operating system functioning on a computing device in accordance with the present invention.

FIG. 18 is a schematic block diagram of an embodiment of an application specific operating system functioning on a node 37 of a computing device 18. The application specific operating system includes a process management instruction set 120, a device management instruction set 122, a file system management instruction set 124, and a memory management instruction set 126.

The node 37 includes a central processing module (CPM) 100, main volatile memory 40, a non-volatile (NV) memory interface unit 102, and a network interface unit 104. The central processing module 100 includes one or more processing modules (e.g., 1-*cc*, where cc is an integer greater than or equal to 4 in this example) and cache memory. The NV memory interface unit 102 includes one or more NV memory interface modules (e.g., 1-*aa*, where aa is an integer greater than or equal to 4 in this example). The network interface unit 104 includes one or more network interface modules (e.g., 1-*bb*, where bb is an integer greater than or equal to 4 in this example). Each NV memory interface module is coupled to one or more non-volatile memory devices (e.g., memory 38) of the node and/or computing device and each network interface module is coupled to a network card of the node and/or computing device.

Within the node 37, data 112 and instructions 114 are conveyed between processing module(s) of the core processing module (CPM) 100 (and the associated cache), the main volatile memory 40, and non-volatile (NV) memory device(s) coupled to the NV interface unit 102. In addition, input/output (IO) data 116 is conveyed within the node 37 between network card(s) via the network interface unit 104, processing module(s) of the CPM 100, and the main volatile memory 40. The instructions 114 are from an instruction set regarding one of the operations of the application specific operating system and/or instructions from one or more instruction sets of operations of user applications (e.g., database instruction sets). The instructions form a process 110, which is executed by the processing module(s). The data 112 and the IO data 116 are acted upon by the processing module(s) in accordance with a process(es) to produce new data 112 and/or new IO data 116. In this embodiment, data 112 is data that is stored or will be stored in the main volatile memory and/or in the NV memory device(s) and the IO data 116 is transceived via the network interface unit 104. In addition, IO data 116 is received via the network interface unit 114, processed by the processing module(s) to produce new data 112, which is subsequently stored in the main volatile memory 40 and/or in the NV memory device(s).

In an example, the node 37 operates in accordance with the process management instruction set 120, the device management instruction set 122, the file system management instruction set 124, and the memory management instruction set 126 of the application specific operating system. The memory management instruction set 122 includes one or more operations for coordinating use of the main volatile memory 40 and/or use of the NV memory devices via the NV interface unit 102. As a specific example, a memory management operation divides the main volatile memory 40 into two primary sections: one for general computer operations and another for application specific operations. The application specific section of the main volatile memory 40 is available only to application specific operations in accordance with the application specific operating system. The computing device operating system will treat the application specific section of the main volatile memory 40 is if it does not exist.

In addition, the memory management instruction set 122 divides the application specific section of the main volatile memory 40 into sub-sections: a first sub-section 53 for disk memory operations with respect to the non-volatile (NV) memory device(s) via the NV interface unit 102; a second sub-section 54 for network operations with respect to network card(s) via the network interface unit 104; a third sub-section 55 for general use by the processing module(s); and more as needed. The memory management instruction set 122 may set these sub-sections up in a variety of ways.

For example, the memory management instruction set 122 sets up the sub-sections at boot up of the computing device. In another example, the memory management instruction set 122 sets up the sub-sections in a dynamic manner on an as-needed basis. In yet another example, the memory management instruction set 122 dynamically shifts boundaries of the sub-sections among each other on an as-needed basis.

Within a sub-section, the memory management instruction set 122 provides page information (e.g., page size, page table structure and content, page swapping, etc.). For example, the memory management instruction set 122 establishes page information for the sub-section regarding the NV memory device(s) to have a page size corresponding to a conventional page size for NV memory (e.g., 4 Kilo-Bytes, or integer multiples thereof). As another example, the memory management instruction set 122 establishing page information for the sub-section regarding the network interface unit 104 to have a page size corresponding to network traffic data size (e.g., 1 Mega-Byte or more). In this manner, data 112, instructions 114, and/or IO data 116 can be readily conveyed within the node without page conversion (e.g., have to change page size or other manipulations).

The memory management instruction set 122 further functions to create temporary buffers within a sub-section. For example, the memory management instruction set 122 creates a temporary buffer within the disk sub-section 53 for temporary storage of data being retrieved from the NV memory device(s). This allows for the data to be stored in a requested order even if the NV memory device(s) respond to read requests out of order.

The device management instruction set 122 functions to group devices into core processing resources. For example, the device management instruction set 122 groups processing module 2, NV memory module 2, and network interface module 2 into a core processing resource that is able to operate independently of other core processing resources of the node. In this manner, the process management instruction set 120 coordinates operation at an individual level for the core processing resources and also coordinates operation between the core processing resources at a node level. In addition, the process management instruction set 120 coordinates operation between nodes of a computing device.

The file system management instruction set 124 coordinates logical addressing for the data 112, the instructions 114, and/or the IO data 116 when it is to be stored. For example, when a table is being stored, it is stored based on the structure of the table. For instance, a table includes rows and columns; where each row corresponds to a different record. The records are ordered within the table. The file system management instruction set 124 functions to store in the table, or portions thereof, in an ordered manner corresponding to the ordered manner of the table. As such, record 1 of the table, or a portion of the table, is stored at a logical address within NV memory of a node at a first logical address; record 2 is stored at a second logical address that is based on the first logical address and an address offset (e.g., which corresponds to the size of records in the table); record 3 is stored at a third logical address that is based on the second logical address and the address offset or the first logical address and a multiple of the address offset; and so on.

In this manner, the file system for the computing device is optimized for the specific type of data being stored. This enables for faster reads, faster writes, faster processing of data, and/or expanded parallelism of data processing. For example, a first computing device receives a first segment of a segment group of a portion of a table; a second computing device receives a second segment of the segment, and a third computing receives a third segment of the segment group. Within the first computing device, the first segment is divided in an orderly manner to produce segment divisions. Each node is allocated a segment division, where node 1 is allocated division 1, node 2 is allocated division 2, and so on.

Figure 19:
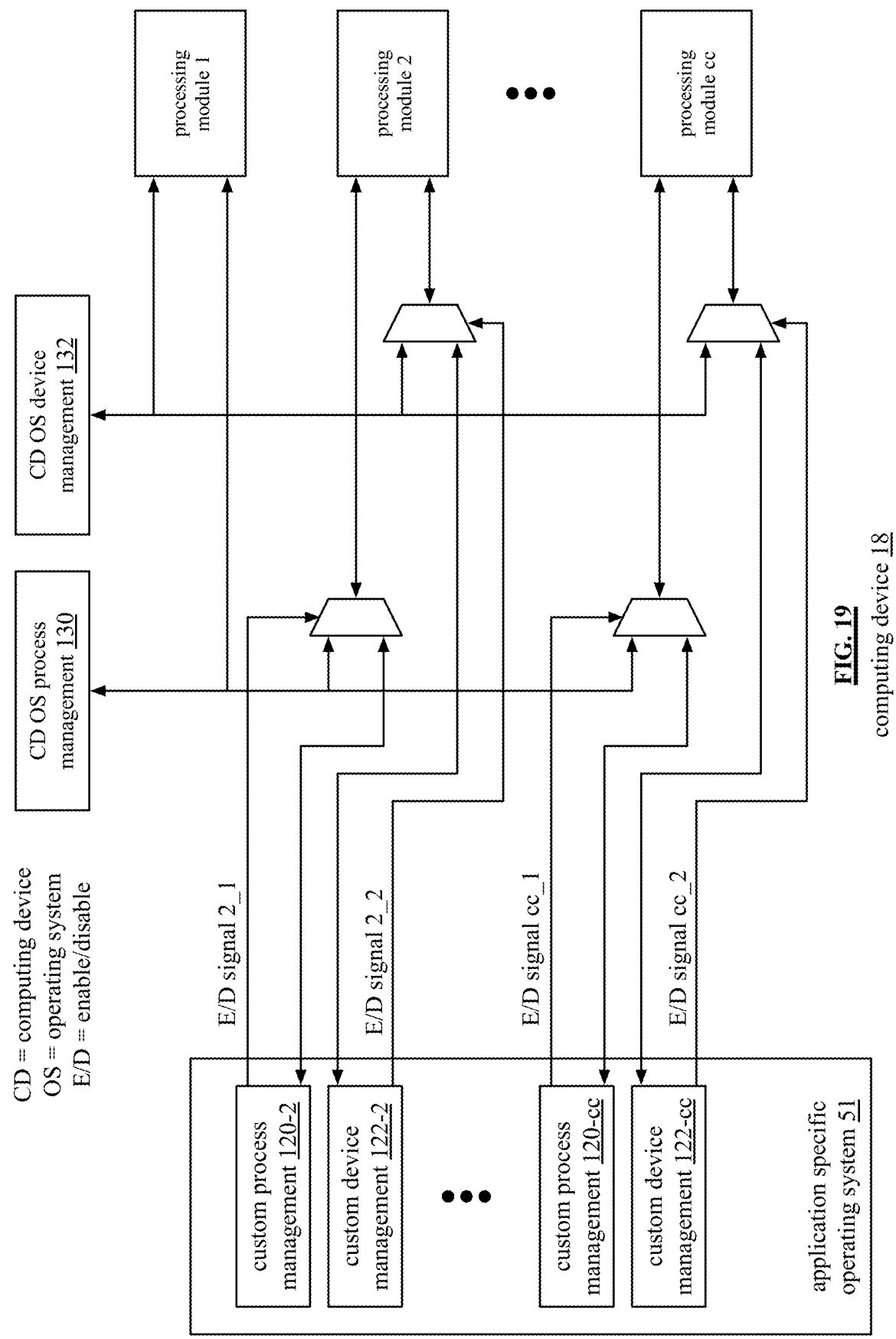
FIG. 19 is a schematic block diagram of an embodiment of a portion of an application specific operating system functioning on a computing device in accordance with the present invention.

FIG. 19 is a schematic block diagram of an example of a computing device 18 having an application specific operating system 51 and a computing device operating system (CD OS) for its processing modules (1-cc). In this example, processing module 1 is operable in accordance with the CS OS process management operation 130 and CD OS device management operation 132 of the computing device OS. The remaining processing modules 2-cc are selectively operable in accordance with the CS OS or in accordance with the application specific operating system 51.

For instance, processing module 2 is operable, for device management, in accordance with the CS OS or the application specific OS 51. In particular, a custom device management instruction set for processing module 2 generates an enable/disable signal to select which device management to use. For example, when the signal is enabled and via the multiplexer (which is a logical function), processing module 2 operates in accordance with the custom device management instruction set 120-2 of the application specific OS 51. When the signal is disabled, processing module 2 operates in accordance with the CD OS device management 132 instruction set.

In addition, processing module 2 is operable, for process management, in accordance with the CS OS or the application specific OS 51. In particular, a custom process management instruction set for processing module 2 generates an enable/disable signal to select which process management to use. For example, when the signal is enabled and via the multiplexer, processing module 2 operates in accordance with the custom process management instruction set 122-2 of the application specific OS 51. When the signal is disabled, processing module 2 operates in accordance with the CD OS process management 130 instruction set.

Each of the remaining processing modules have similar selectability as to which device management instruction set to use or which process management instruction set to use. In this embodiment, each processing module has its own custom process management instruction set 120-2 through 120-cc and its own custom device management instruction set 122-2 through 122-cc.

Figure 20:
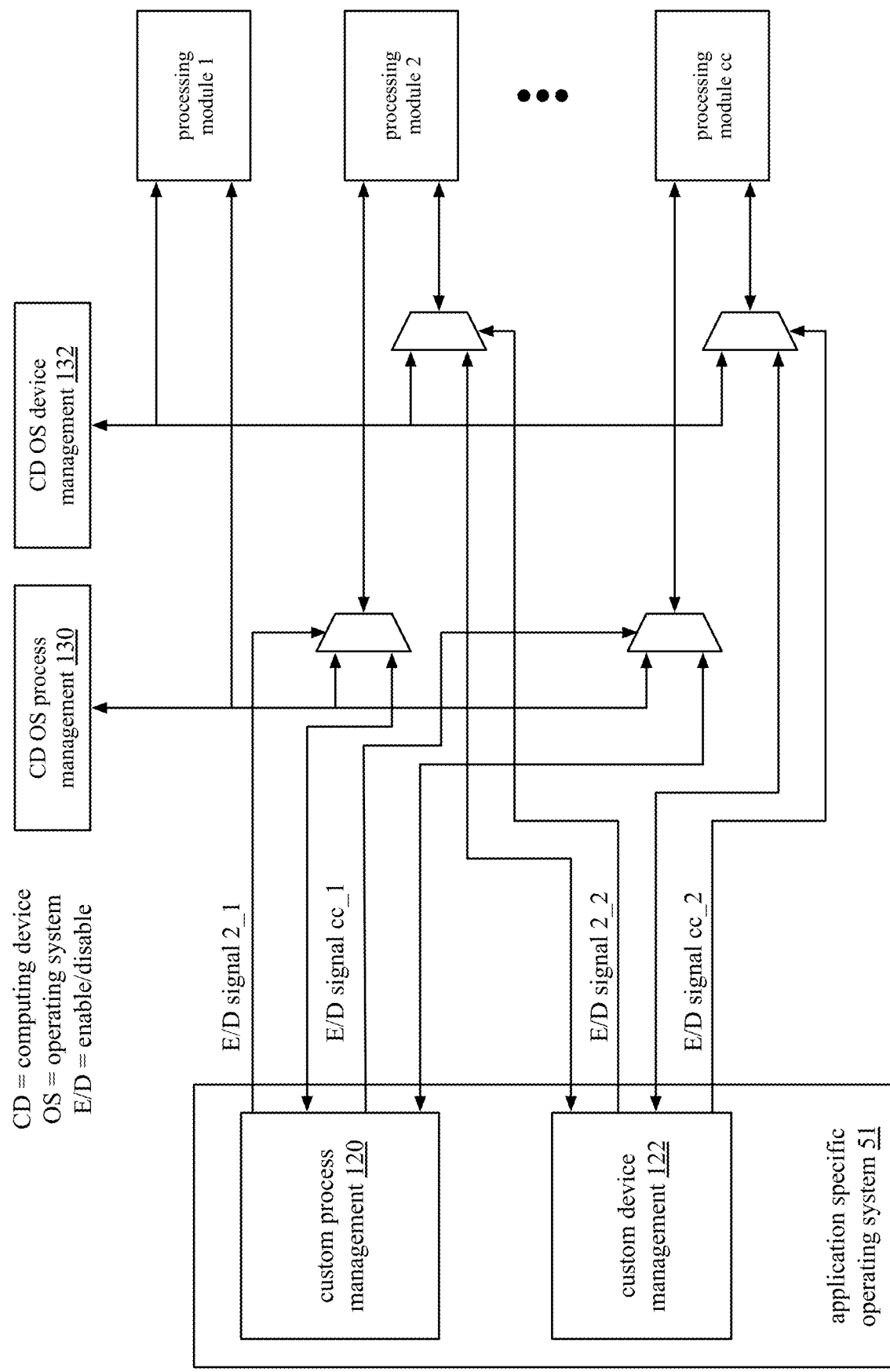
FIG. 20 is a schematic block diagram of another embodiment of a portion of an application specific operating system functioning on a computing device in accordance with the present invention.

FIG. 20 is a schematic block diagram that is similar to FIG. 19 with the difference being that this figure includes a common custom processing management instruction set 120 and a common device management instruction set 122 of the application specific operating system 51. For example, the device management instruction set 122 is common for processing modules 2-cc; yet, for each processing module, the particular device management instruction set to use (e.g., 122 or 132) is individually selectable. As another example, the process management instruction set 120 is common for processing modules 2-cc; yet, for each processing module, the particular process management instruction set to use (e.g., 120 or 130) is individually selectable.

Figure 21:
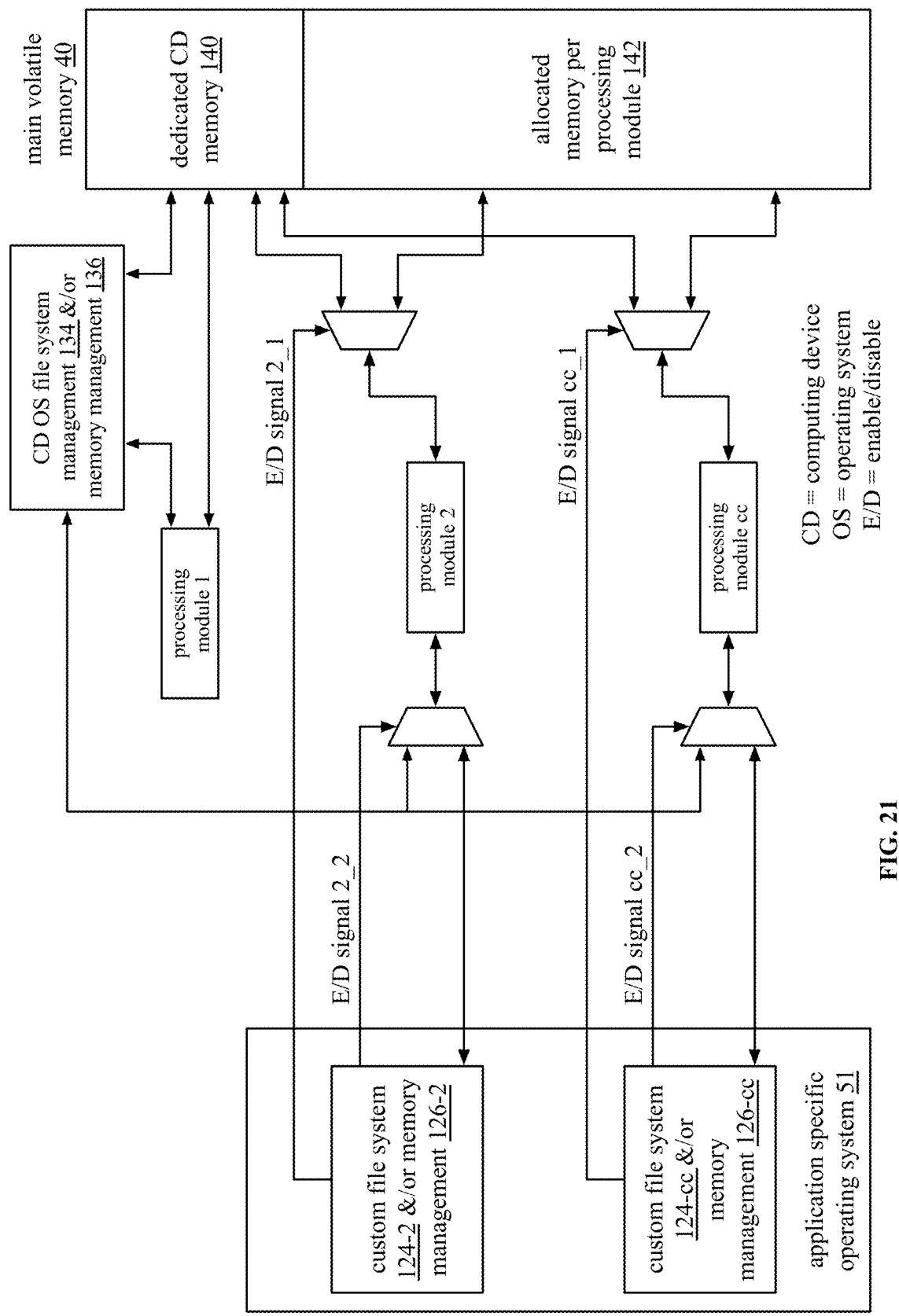
FIG. 21 is a schematic block diagram of an embodiment of another portion of an application specific operating system functioning on a computing device in accordance with the present invention.

FIG. 21 is a schematic block diagram of an example of a computing device 18 having an application specific operating system 51 and a computing device operating system (CD OS) for its processing modules (1-cc) and the main volatile memory 40. In this example, the main volatile memory 40 is divided into two sections: a first section 140 that is dedicated for use in conjunction with the computing device operating system and a second section 142 that is dedicated for use in conjunction with the application specific operating system 51.

In this example, processing module 1 and the dedicated CD memory 140 are operable in accordance with the CS OS file system management operation 134 and CD OS memory management operation 132 of the computing device OS. The remaining processing modules 2-cc are selectively operable in accordance with the CS OS or in accordance with the application specific operating system 51.

For instance, processing module 2 is operable, for file system management and/or memory management, in accordance with the CS OS or the application specific OS 51. In particular, a custom file system 124-2 and/or memory 126-2 management instruction sets for processing module 2 generate an enable/disable signal to select which file system and/or memory management to use. For example, when the signal is enabled and via the multiplexer (which is a logical function), processing module 2 and a portion of memory section 142 operate in accordance with the custom file system 124-2 and/or memory 126-2 management instruction set(s) of the application specific OS 51. When the signal is disabled, processing module 2 operates in accordance with the CD OS file system 134 and/or memory 136 management instruction sets.

Each of the remaining processing modules have similar selectability as to which file system management instruction set to use and/or which memory management instruction set to use. In this embodiment, each processing module has its own custom file system and/or memory management instruction set(s) 124-2 through 124-cc and/or 126-2 through 126-cc.

Figure 22:
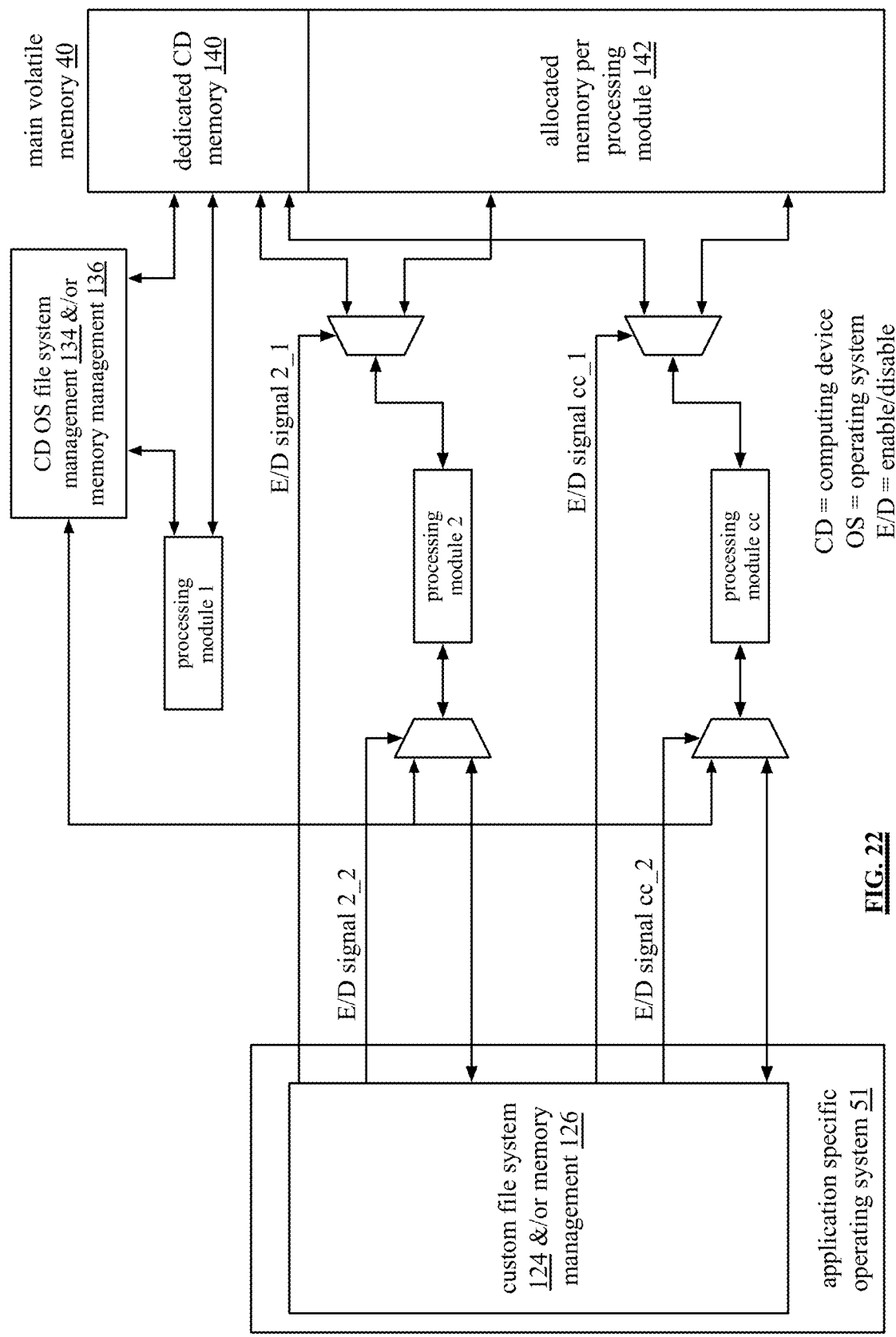
FIG. 22 is a schematic block diagram of another embodiment of another portion of an application specific operating system functioning on a computing device in accordance with the present invention.

FIG. 22 is a schematic block diagram that is similar to FIG. 21 with the difference being that this figure includes a common custom file system and/or memory management instruction sets 124 and/or 126 of the application specific operating system 51. For example, the file system management instruction set 124 is common for processing modules 2-cc; yet, for each processing module, the particular file system management instruction set to use (e.g., 124 or 134) is individually selectable. As another example, the memory management instruction set 126 is common for processing modules 2-cc; yet, for each processing module, the particular memory management instruction set to use (e.g., 126 or 136) is individually selectable.

Figure 23:
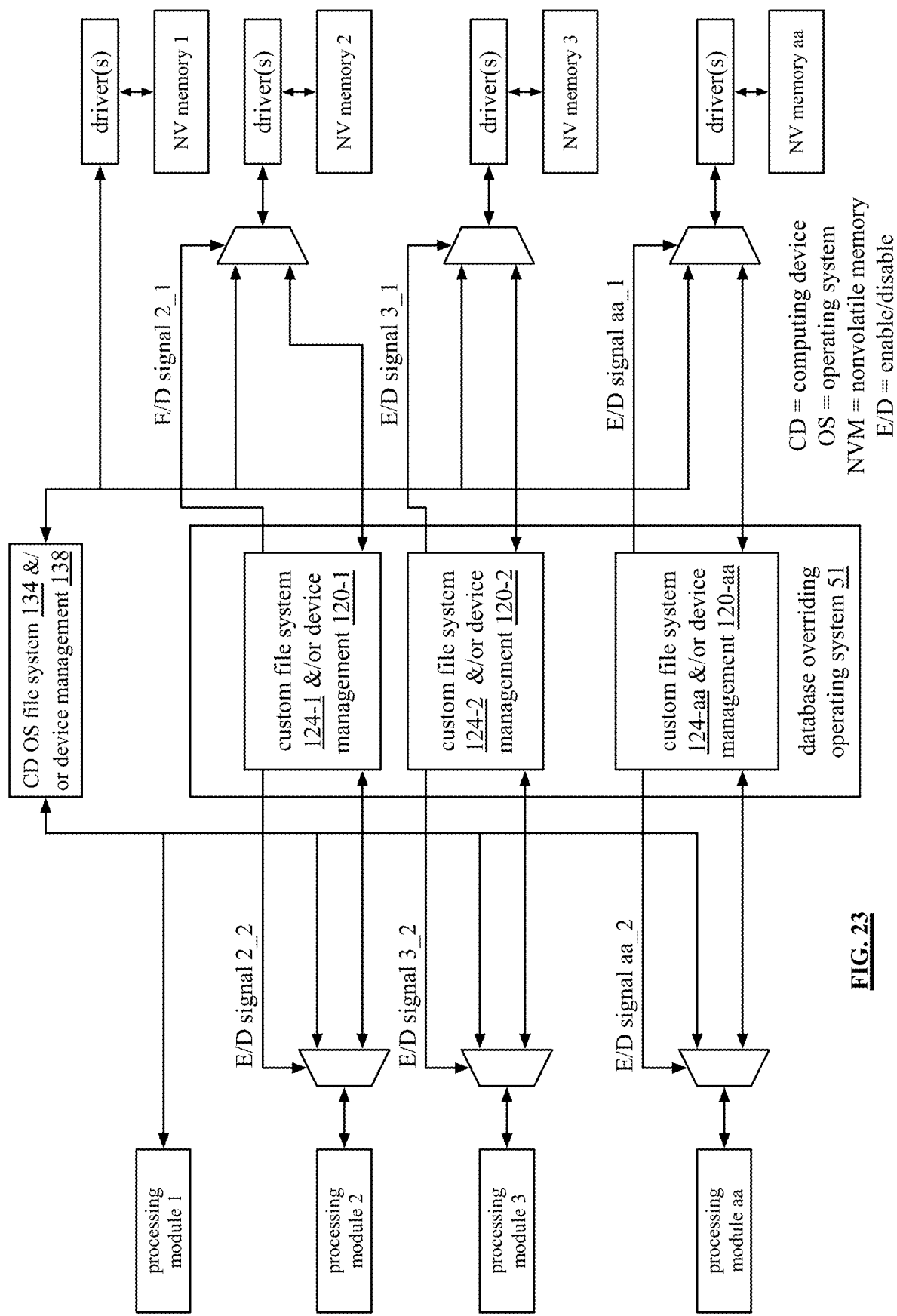
FIG. 23 is a schematic block diagram of an embodiment of yet another portion of an application specific operating system functioning on a computing device in accordance with the present invention.

FIG. 23 is a schematic block diagram of an example of a computing device 18 having an application specific operating system 51 and a computing device operating system (CD OS) for its processing modules (1-aa) and the non-volatile (NV) memory (1-aa) (e.g., each NV memory includes one or more NV memory devices coupled to a NV memory interface module that includes a driver). In this example, processing module 1 and the NV memory 1 are operable in accordance with the CS OS file system management operation 134 and CD OS device management operation 138 of the computing device OS. The remaining processing modules 2-cc are selectively operable in accordance with the CS OS or in accordance with the application specific operating system 51. Similarly, the remaining NV memories 2-aa are selectively operable in accordance with the CS OS or in accordance with the application specific operating system 51.

For instance, processing module 2 and NV memory 2 are operable, for file system management and/or device management, in accordance with the CS OS or the application specific OS 51. In particular, a custom file system 124-1 and/or device 120-1 management instruction sets for processing module 2 and NV memory 2 generate an enable/disable signal to select which file system and/or device management to use. For example, when the signal is enabled and via the multiplexer (which is a logical function), processing module 2 and NV memory 2 operate in accordance with the custom file system 124-1 and/or device 120-1 management instruction set(s) of the application specific OS 51. When the signal is disabled, processing module 2 and NV memory 2 operate in accordance with the CD OS file system 134 and/or device 138 management instruction sets.

Each of the remaining processing modules (3-aa) and NV memories (3-aa) have similar selectability as to which file system management instruction set to use and/or which device management instruction set to use. In this embodiment, each processing module and corresponding NV memory have their own custom file system and/or device management instruction set(s) 124-2 through 120-cc and/or 120-2 through 120-aa.

Figure 24:
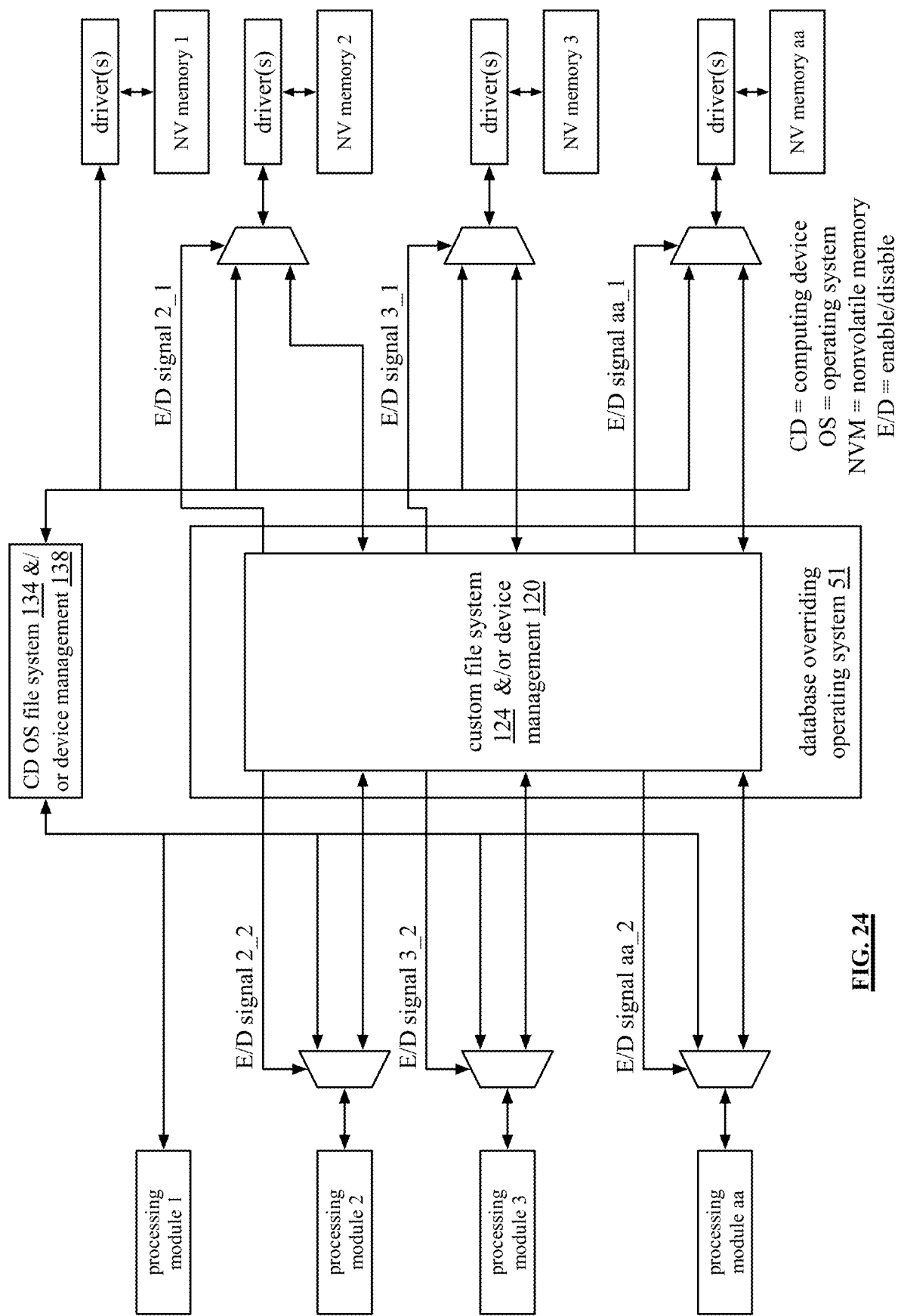
FIG. 24 is a schematic block diagram of another embodiment of yet another portion of an application specific operating system functioning on a computing device in accordance with the present invention.

FIG. 24 is a schematic block diagram that is similar to FIG. 23 with the difference being that this figure includes a common custom file system and/or device management instruction sets 124 and/or 120 of the application specific operating system 51. For example, the file system management instruction set 124 is common for processing modules 2-aa and NV memories 2-aa; yet, for each processing module and corresponding NV memory, the particular file system management instruction set to use (e.g., 124 or 134) is individually selectable. As another example, the device management instruction set 120 is common for processing modules 2-aa and NV memories 2-aa; yet, for each processing module and corresponding NV memory, the particular device management instruction set to use (e.g., 120 or 138) is individually selectable.

Figure 25:
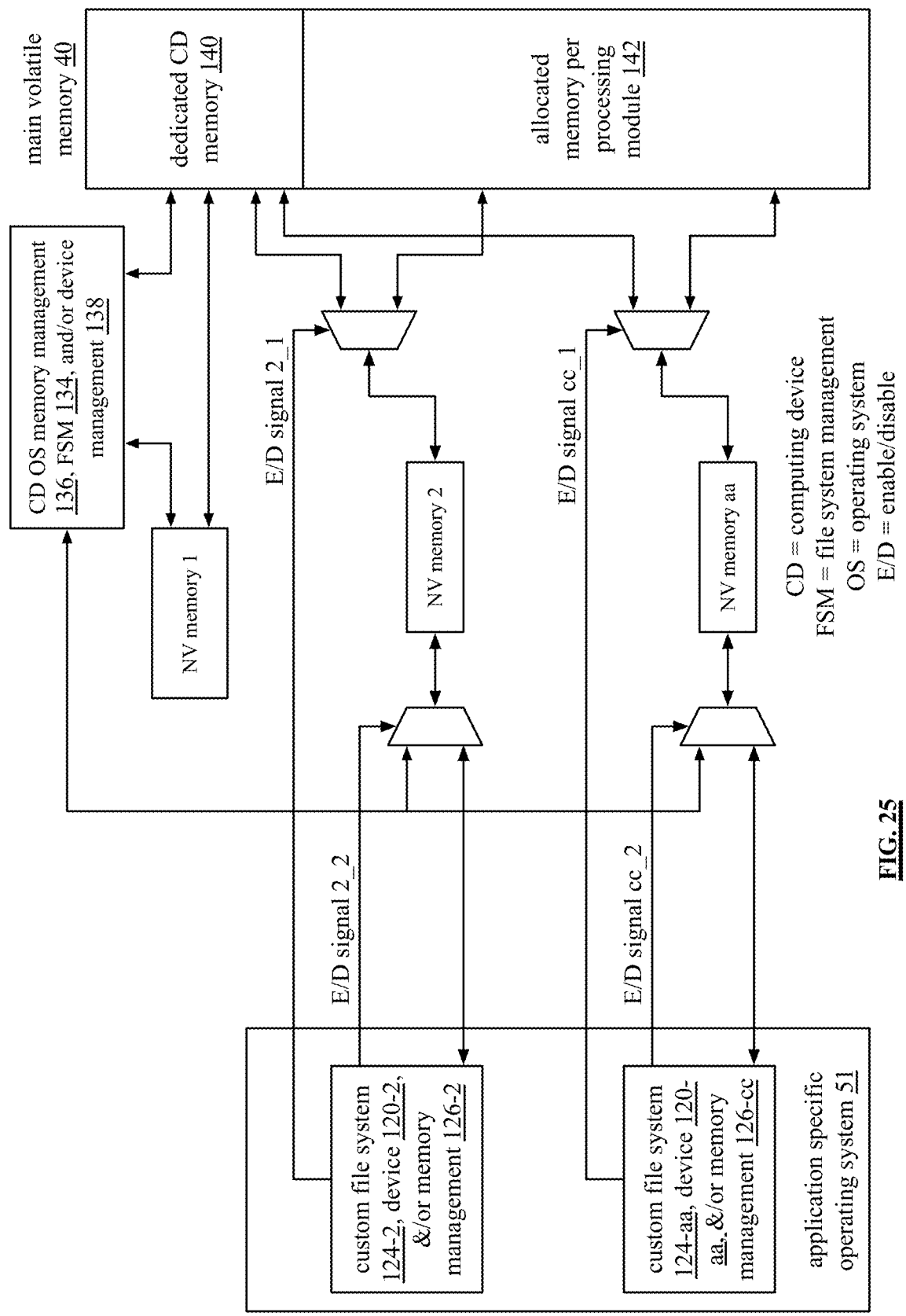
FIG. 25 is a schematic block diagram of an embodiment of a further portion of an application specific operating system functioning on a computing device in accordance with the present invention.

FIG. 25 is a schematic block diagram of an example of a computing device 18 having an application specific operating system 51 and a computing device operating system (CD OS) for its NV memories (1-aa) (e.g., e.g., each NV memory includes one or more NV memory devices coupled to a NV memory interface module that includes a driver) and the main volatile memory 40. In this example, the main volatile memory 40 is divided into two sections: a first section 140 that is dedicated for use in conjunction with the computing device operating system and a second section 142 that is dedicated for use in conjunction with the application specific operating system 51.

In this example, NV memory 1 and the dedicated CD memory 140 are operable in accordance with the CS OS file system management operation 134, the CD OS device management operation 138, and CD OS memory management operation 132 of the computing device OS. The remaining NV memories 2-aa are selectively operable in accordance with the CS OS or in accordance with the application specific operating system 51.

For instance, NV memory 2 is operable, for file system management, device management, and/or memory management, in accordance with the CS OS or the application specific OS 51. In particular, a custom file system 124-2, a device 120, and/or memory 126-2 management instruction sets for NV memory 2 generate an enable/disable signal to select which file system, device management, and/or memory management to use. For example, when the signal is enabled and via the multiplexer (which is a logical function), NV memory 2 and a portion of memory section 142 operate in accordance with the custom file system 124-2, device 120-2, and/or memory 126-2 management instruction set(s) of the application specific OS 51. When the signal is disabled, NV memory 2 operates in accordance with the CD OS file system 134, device 138, and/or memory 136 management instruction sets.

Each of the remaining NV memories (3-*aa*) have similar selectability as to which file system management instruction set to use, which device management instruction set to use, and/or which memory management instruction set to use. In this embodiment, each NV memory has its own custom file system, device, and/or memory management instruction set(s) 124-2 through **124-*aa*, 120-2 through 120-*aa*, and/or 126-2 through 126-*cc***.

Figure 26:
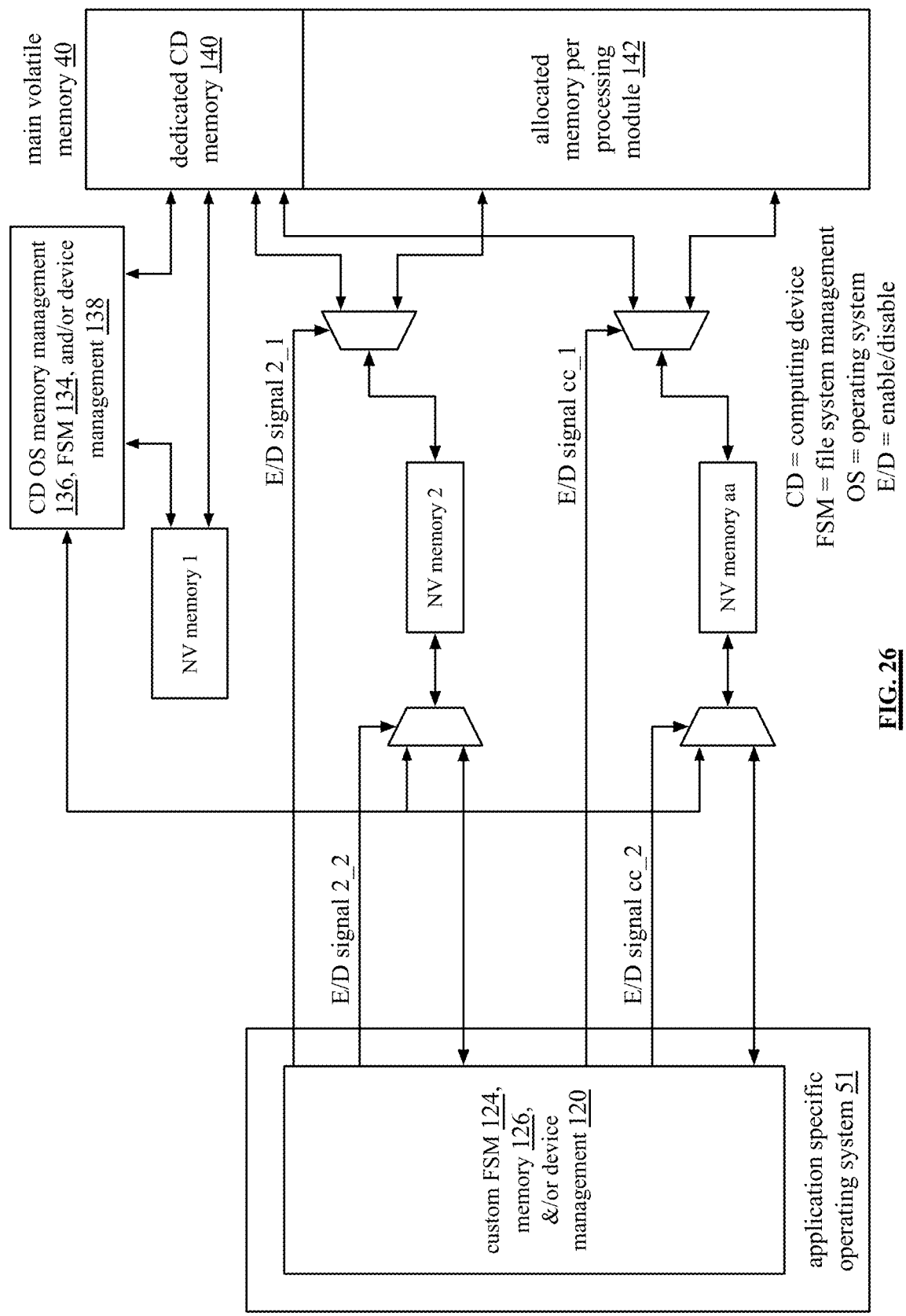
FIG. 26 is a schematic block diagram of another embodiment of a further portion of an application specific operating system functioning on a computing device in accordance with the present invention.

FIG. 26 is a schematic block diagram that is similar to FIG. 25 with the difference being that this figure includes a common custom file system, device, and/or memory management instruction sets 124, 120, and/or 126 of the application specific operating system 51. For example, the file system management instruction set 124 is common for NV memories **2-*aa*; yet, for each NV memory, the particular file system management instruction set to use (e.g., 124 or 134) is individually selectable. As another example, the memory management instruction set 126 is common for NV memories 2-*aa*; yet, for each NV memory, the particular memory management instruction set to use (e.g., 126 or 136) is individually selectable. As a further example, the device management instruction set 120 is common for NV memories 2-*aa*; yet, for each NV memory, the particular device management instruction set to use (e.g., 120 or 130**) is individually selectable.

As may be used herein, the terms "substantially" and "approximately" provide an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, a set of memory locations within a memory device or a memory section. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A database system, comprising:
a plurality of computing devices of at least one subsystem of the database system, wherein each of the plurality of computing devices comprises:
  a plurality of processing modules;
  a computing device operating system comprising a computing device operating system file system management instruction set; and
  an application specific operating system comprising at least one custom file system management instruction set operable to configure operation of a configurable set of processing modules of the plurality of processing modules based on generating, for each processing module of the configurable set of processing modules, a corresponding file system management configuration signal indicating a selected file system management instruction set of one of: the computing device operating system, or the application specific operating system;
wherein the each processing module of the configurable set of processing modules operates in accordance with the selected file system management instruction set based on the corresponding file system management configuration signal.

2. The database system of claim 1,
wherein the computing device operating system further comprises a computing device operating system memory management instruction set;
wherein the application specific operating system further comprises at least one custom memory management instruction set operable to further configure operation of the configurable set of processing modules based on generating, for the each processing module of the configurable set of processing modules, a corresponding memory management configuration signal indicating a selected memory management instruction set of one of: the computing device operating system, or the application specific operating system;
wherein the each processing module further operates in accordance with the selected memory management instruction set based on the corresponding memory management configuration signal.

3. The database system of claim 1, wherein the configurable set of processing modules is a proper subset of the plurality of processing modules, and wherein at least one remaining processing module is always operable in accordance with the computing device operating system file system management instruction set and the computing device operating system memory management instruction set of the computing device operating system.

4. The database system of claim 3, wherein the at least one remaining processing module includes exactly one processing module of the plurality of processing modules, and wherein the configurable set of processing modules includes all processing modules of the of the plurality of processing modules except for the exactly one processing module of the plurality of processing modules.

5. The database system of claim 1, wherein the at least one custom file system management instruction set includes a plurality of different custom file system management instruction sets, wherein each of the plurality of different custom file system management instruction sets is operable to configure only a corresponding proper subset of the configurable set of processing modules of a plurality of proper subsets of the configurable set of processing modules, wherein the plurality of proper subsets of the configurable set of processing modules are mutually exclusive and collectively exhaustive with respect to the configurable set of processing modules, and wherein operations performed by the each of the configurable set of processing modules are configured by one corresponding custom file system management instruction set of the plurality of different custom file system management instruction sets.

6. The database system of claim 5, wherein a number of custom file system management instruction sets in the plurality of different custom file system management instruction sets is equal to a number of processing modules in the configurable set of processing modules, wherein each of the plurality of different custom file system management instruction sets is operable to configure exactly one processing module in the configurable set of processing modules based on generating exactly one corresponding file system management configuration signals.

7. The database system of claim 6,
wherein a first processing module of the plurality of processing modules operates in accordance with a first custom file system management instruction set of the plurality of different custom file system management instruction sets based on the first custom file system management instruction set being operable to configure the first processing module, and further based on the first custom file system management instruction set generating a first file system management configuration signal dictating that the first processing module operate in accordance with the first custom file system management instruction set;
wherein a second processing module of the plurality of processing operates in accordance with a second custom file system management instruction set of the plurality of different custom file system management instruction sets based on the second custom file system management instruction set being operable to configure the second processing module, and further based on the second custom file system management instruction set generating a second file system management configuration signal dictating that the second processing module operate in accordance with the second custom file system management instruction set; and
wherein a third processing module of the plurality of processing modules operates in accordance with the computing device operating system file system management instruction set based on a third custom file system management instruction set of the plurality of different custom file system management instruction sets being operable to configure the third processing module, and further based on the third custom file system management instruction set generating a third file system management configuration signal dictating that the third processing module operate in accordance with the computing device operating system file system management instruction set.

8. The database system of claim 1, wherein the at least one custom file system management instruction set includes exactly one custom file system management instruction set common to all of the configurable set of processing modules, wherein the exactly one custom file system management instruction set is operable to generate a plurality of file system management configuration signals, wherein each file system management configuration signal of the plurality of file system management configuration signals configures a corresponding one of the configurable set of processing modules.

9. The database system of claim 8, wherein each of a first non-null proper subset of the configurable set of processing modules operates in accordance with the exactly one custom file system management instruction set, wherein each of a second non-null proper subset of the configurable set of processing modules operates in accordance with the computing device operating system file system management instruction set, and wherein the first non-null proper subset and the second non-null proper subset are mutually exclusive and collectively exhaustive with respect to the set of configurable processing modules.

10. The database system of claim 1,
wherein the each of the configurable set of processing modules operates via the custom file system management instruction set of the application specific operating system when the corresponding file system management configuration signal is enabled; and
wherein the each of the configurable set of processing modules operates via the computing device operating system file system management instruction set of the computing device operating system when the corresponding file system management configuration signal is disabled.

11. The database system of claim 1, wherein the plurality of computing devices are allocated to various applications of the at least one sub-system of the database system based on execution, by corresponding sets of configurable processing modules of corresponding ones of the plurality of computing devices, of operational instructions of corresponding file system management instruction sets configured via corresponding file system management configuration signals.

12. The database system of claim 1, wherein each of the plurality of computing devices further comprises:
a plurality of non-volatile memory;
wherein the at least one custom file system management instruction set is further operable to configure operation of a configurable set of non-volatile memory of the plurality of non-volatile memory based on further generating, for each non-volatile module of the configurable set of processing modules, a corresponding signal indicating a selected instruction set of one of: the computing device operating system, or the application specific operating system;
wherein the each non-volatile memory of the configurable set of non-volatile memory operates in accordance with the selected instruction set based on the corresponding signal.

13. The database system of claim 12, wherein each of the plurality of computing devices further comprises:
a plurality of memory interface module that each include a driver;
wherein the each non-volatile memory includes at least one memory device coupled to a corresponding memory interface module via the driver.

14. The database system of claim 12,
wherein a first processing module of the plurality of processing modules and a first non-volatile memory of the plurality of non-volatile memory both operate in accordance with a first custom file system management instruction set of the plurality of different custom file system management instruction sets based on the first custom file system management instruction set being operable to configure the first processing module and the first non-volatile memory, and further based on the first custom file system management instruction set generating a first file system management configuration signal dictating that the first processing module operate in accordance with the first custom file system management instruction set and further generating a first signal dictating that the first non-volatile memory operate in accordance with the first custom file system management instruction set;

wherein a second processing module of the plurality of processing modules and a second non-volatile memory of the plurality of non-volatile memory both operate in accordance with a second custom file system management instruction set of the plurality of different custom file system management instruction sets based on the second custom file system management instruction set being operable to configure the second processing module and the second non-volatile memory, and further based on the second custom file system management instruction set generating a second file system management configuration signal dictating that the second processing module operate in accordance with the second custom file system management instruction set and further generating a second signal dictating that the second non-volatile memory operate in accordance with the second custom file system management instruction set.

15. The database system of claim 12,
wherein at least one processing module of the plurality of processing modules and at least one non-volatile memory of the plurality of non-volatile memory both operate in accordance with the computing device operating system file system management instruction set.

16. The database system of claim 1, wherein the each of the plurality of computing devices further comprises a main volatile memory, wherein the main volatile memory comprises:
a first memory section configured for dedicated use in conjunction with the computing device operating system; and
a second memory section configured for dedicated use in conjunction with the application specific operating system,
wherein the at least one custom file system management instruction set is further operable to configure operation of the second memory section based on further generating, for the each processing module of the configurable set of processing modules, a corresponding signal indicating a selected instruction set of the application specific operating system.

17. The database system of claim 16, wherein the second memory section is allocated for use by the set of configurable processing modules based on allocating required memory for the each processing module to operate in accordance with the selected file system management instruction set.

18. The database system of claim 1, wherein the application specific operating system is implemented as a database overriding operating system.

19. A computing device of a database system, comprising:
a plurality of processing modules;
a computing device operating system comprising a computing device operating system file system management instruction set; and
an application specific operating system comprising at least one custom file system management instruction set operable to configure operation of a configurable set of processing modules of the plurality of processing modules based on generating, for each processing module of the configurable set of processing modules, a corresponding file system management configuration signal indicating a selected file system management instruction set of one of: the computing device operating system, or the application specific operating system;
wherein the each processing module of the configurable set of processing modules operates in accordance with the selected file system management instruction set based on the corresponding file system management configuration signal.

20. A database system, comprising:
a plurality of computing devices of at least one subsystem of the database system, wherein each of the plurality of computing devices comprises:
a plurality of processing modules;
a computing device operating system comprising a computing device operating system memory management instruction set; and
an application specific operating system comprising at least one custom memory management instruction set operable to configure operation of a configurable set of processing modules of the plurality of processing modules based on generating, for each processing module of the configurable set of processing modules, a corresponding memory management configuration signal indicating a selected memory management instruction set of one of: the computing device operating system, or the application specific operating system;
wherein the each processing module of the configurable set of processing modules operates in accordance with the selected memory management instruction set based on the corresponding memory management configuration signal.

* * * * *